US012713610B2

(12) United States Patent
Kwon et al.

(10) Patent No.: US 12,713,610 B2
(45) Date of Patent: Aug. 18, 2026

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Joonyoung Kwon, Suwon-si (KR); Jiyoung Kim, Suwon-si (KR); Junhyoung Kim, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 377 days.

(21) Appl. No.: 18/437,604

(22) Filed: Feb. 9, 2024

(65) Prior Publication Data

US 2025/0048628 A1 Feb. 6, 2025

(30) Foreign Application Priority Data

Aug. 3, 2023 (KR) ........................ 10-2023-0101702

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ..................................................... H10B 43/27
(Continued)

(56) References Cited

U.S. PATENT DOCUMENTS 6,813,184 B2 11/2004 Lee
2021/0398998 A1 12/2021 Jung et al.
(Continued)

FOREIGN PATENT DOCUMENTS

CN 113921532 1/2022
CN 114093829 2/2022
(Continued)

OTHER PUBLICATIONS

Extended European Search Report in European Appln. No. 24173559.6, mailed on Oct. 15, 2024, 11 pages.

*Primary Examiner* — Ajay Arora
(74) *Attorney, Agent, or Firm* — Fish & Richardson P.C.

(57) ABSTRACT

The present disclosure relates to three-dimensional (3D) semiconductor memory devices and electronic systems. An example 3D semiconductor memory device comprises a peripheral circuit structure on a peripheral substrate, a stack structure that includes a plurality of gate electrodes stacked on the peripheral circuit structure, an n-doped pattern on the stack structure, a vertical structure that extends through the stack structure into the n-doped pattern, a p-doped pattern on the n-doped pattern, and an undoped pattern between the n-doped pattern and then p-doped pattern. The p-doped pattern includes a p-doped horizontal pattern on the undoped pattern, and a p-doped vertical pattern that extends through the undoped pattern and the n-doped pattern and that contacts with the vertical structure.

20 Claims, 28 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/35*** | (2023.01) |
| ***H10B 43/40*** | (2023.01) |
| ***H10B 80/00*** | (2023.01) |
| ***H10W 20/41*** | (2026.01) |
| ***H10W 90/00*** | (2026.01) |

(52) U.S. Cl.
CPC ............. *H10B 41/40* (2023.02); *H10B 43/10* (2023.02); *H10B 43/35* (2023.02); *H10B 43/40* (2023.02); *H10B 80/00* (2023.02); *H10W 20/435* (2026.01); *H10W 90/00* (2026.01); *H10W 90/752* (2026.01)

(58) Field of Classification Search
USPC .......................................................... 257/314
See application file for complete search history.

(56) References Cited

U.S. PATENT DOCUMENTS

| | | | | |
|---|---|---|---|---|
| 2022/0208748 | A1 | 6/2022 | Rabkin et al. | |
| 2022/0310644 | A1* | 9/2022 | Lee ........................ | H10B 43/27 |
| 2022/0344244 | A1 | 10/2022 | Ryu et al. | |
| 2022/0406811 | A1 | 12/2022 | Arai | |
| 2023/0005952 | A1* | 1/2023 | Choi ...................... | H10B 43/10 |
| 2023/0008539 | A1 | 1/2023 | Lee | |
| 2023/0132530 | A1 | 5/2023 | Wu et al. | |

FOREIGN PATENT DOCUMENTS

| | | |
|---|---|---|
| CN | 114121998 | 3/2022 |
| CN | 114175256 | 3/2022 |
| CN | 114400229 | 4/2022 |
| CN | 114497060 | 5/2022 |
| KR | 10-0437461 | 6/2004 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This application claims priority under 35 U.S.C § 119 to Korean Patent Application No. 10-2023-0101702 filed on Aug. 3, 2023 in the Korean Intellectual Property Office, the disclosure of which is hereby incorporated by reference in its entirety.

BACKGROUND

Semiconductor devices have been integrated to meet performance levels and manufacturing costs required by customers. Integration of two-dimensional or planar semiconductor devices is primarily determined by the area occupied by a unit memory cell, such that it is influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

The present disclosure relates to three-dimensional semiconductor memory devices, including a three-dimensional semiconductor memory device with increased data erase speed, and electronic systems including the same. The three-dimensional semiconductor memory device may offer improved electrical properties and increased reliability.

The subject matter of the present disclosure is not limited to the above, and other subject matter will be understood to those skilled in the art from the following description.

In general, according to some aspects, a three-dimensional semiconductor memory device comprises: a peripheral circuit structure on a peripheral substrate; a stack structure that includes a plurality of gate electrodes stacked on the peripheral circuit structure; an n-doped pattern on the stack structure; a vertical structure that penetrates the stack structure and extends into the n-doped pattern; a p-doped pattern on the n-doped pattern; and an undoped pattern between the n-doped pattern and then p-doped pattern. The p-doped pattern includes: a p-doped horizontal pattern on the undoped pattern; and a p-doped vertical pattern that penetrates the undoped pattern and the n-doped pattern and contacts with the vertical structure.

In general, according to some aspects, a three-dimensional semiconductor memory device comprises: a peripheral circuit structure on a peripheral substrate; a stack structure that includes a plurality of gate electrodes stacked on the peripheral circuit structure; an n-doped pattern on the stack structure; a vertical structure that penetrates the stack structure and extends into the n-doped pattern; an undoped pattern on the n-doped pattern; a p-doped pattern that penetrates the undoped pattern and the n-doped pattern and contacts with the vertical structure; a metal contact electrically connected to the n-doped pattern; and a p-contact plug electrically connected to the p-doped pattern.

In general, according to some aspects, an electronic system comprises: a three-dimensional semiconductor memory device; and a controller electrically connected through an input/output pad to the three-dimensional semiconductor memory device, the controller controlling the three-dimensional semiconductor memory device. The three-dimensional semiconductor memory device includes: a peripheral circuit structure on a peripheral substrate; a stack structure that includes a plurality of gate electrodes stacked on the peripheral circuit structure; an n-doped pattern on the stack structure; a vertical structure that penetrates the stack structure and extends into the n-doped pattern; a p-doped pattern on the n-doped pattern; and an undoped pattern between the n-doped pattern and then p-doped pattern. The p-doped pattern includes: a p-doped horizontal pattern on the undoped pattern; and a p-doped vertical pattern that penetrates the undoped pattern and the n-doped pattern and contacts with the vertical structure.

In general, according to some aspects, a three-dimensional semiconductor memory device comprises: a peripheral circuit structure on a peripheral substrate; a stack structure that includes a plurality of gate electrodes and a plurality of interlayer dielectric layers that are alternately stacked on the peripheral circuit structure; a vertical structure that penetrates the stack structure; and a p-doped pattern that covers the stack structure. The vertical structure includes: a head structure that penetrates an uppermost one of the plurality of gate electrodes; and a through structure below the head structure. The p-doped pattern protrudes into the head structure.

BRIEF DESCRIPTION OF THE DRAWINGS

FIG. 2 illustrates a simplified perspective view showing an example of an electronic system that includes a three-dimensional semiconductor memory device.

DETAILED DESCRIPTION

Some implementations of the present disclosure will now be described in detail with reference to the accompanying drawings to aid in clearly explaining the present disclosure.

Figure 1:
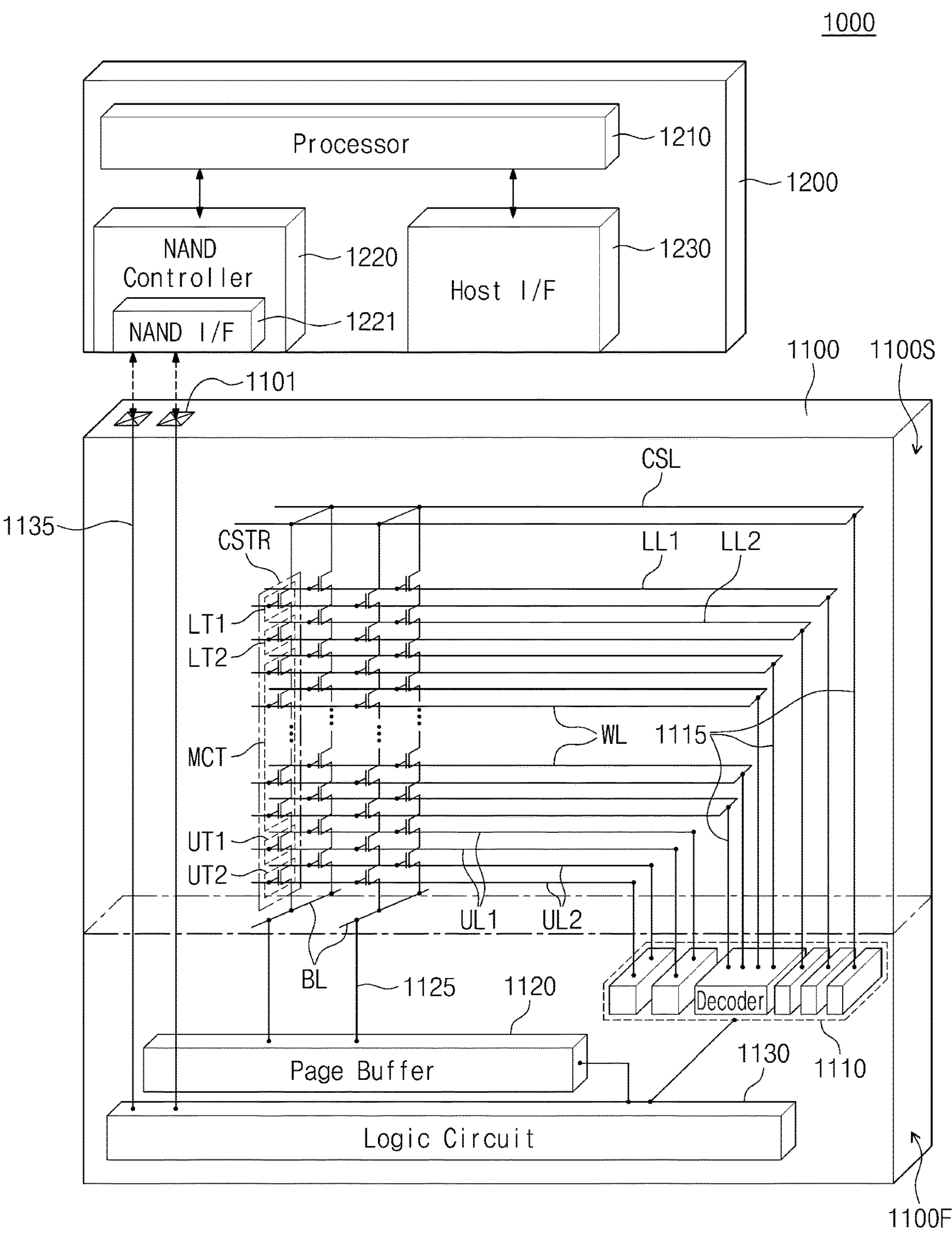
FIG. 1 illustrates a simplified block diagram showing an example of an electronic system that includes a three-dimensional semiconductor memory device.

FIG. 1 illustrates a simplified block diagram showing an example of an electronic system that includes a three-dimensional semiconductor memory device.

Referring to FIG. 1, an electronic system 1000 includes a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic device that includes the storage device. For example, the electronic system 1000 may be a solid state drive (SSD) device, a universal serial bus (USB), a computing system, a medical apparatus, or a communication apparatus each of which includes a single or a plurality of three-dimensional semiconductor memory devices 1100.

The three-dimensional semiconductor memory device 1100 may be a nonvolatile memory device, such as a three-dimensional NAND Flash memory device which will be discussed below. The three-dimensional semiconductor memory device 1100 may include a first region 1100F and a second region 1100S on the first region 1100F. Differently from that shown, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region that includes bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and of the second transistors UT1 and UT2 may be variously changed. The memory cell strings CSTR may be positioned between the common source line CSL and the first region 1100F.

For example, the second transistors UT1 and UT2 may include a string selection transistor, and the first transistors LT1 and LT2 may include a ground selection transistor. The first lines LL1 and LL2 may be gate electrodes of the first transistors LT1 and LT2, respectively. The word lines WL may be gate electrodes of the memory cell transistors MCT, and the second lines UL1 and UL2 may be gate electrodes of the second transistors UT1 and UT2.

For example, the first transistors LT1 and LT2 may include a first erase control transistor and a ground selection transistor that are connected in series. For example, the second transistors UT1 and UT2 may include a string selection transistor and a second erase control transistor.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

In the first region 1100F, the decoder circuit 1110 and the page buffer 1120 may perform a control operation on at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. In some implementations, the electronic system 1000 includes a plurality of three-dimensional semiconductor memory devices 1100, and in this case, the controller 1200 may control the plurality of three-dimensional semiconductor memory devices 1100.

The processor 1210 may control an overall operation of the electronic system 1000 that includes the controller 1200. The processor 1210 may operate based on certain firmware, and may control the NAND controller 1220 to access the three-dimensional semiconductor memory device 1100. The NAND controller 1220 may include an NAND interface 1221 that processes communication with the three-dimensional semiconductor memory device 1100. The NAND interface 1221 may be used to transfer therethrough a control command which is intended to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
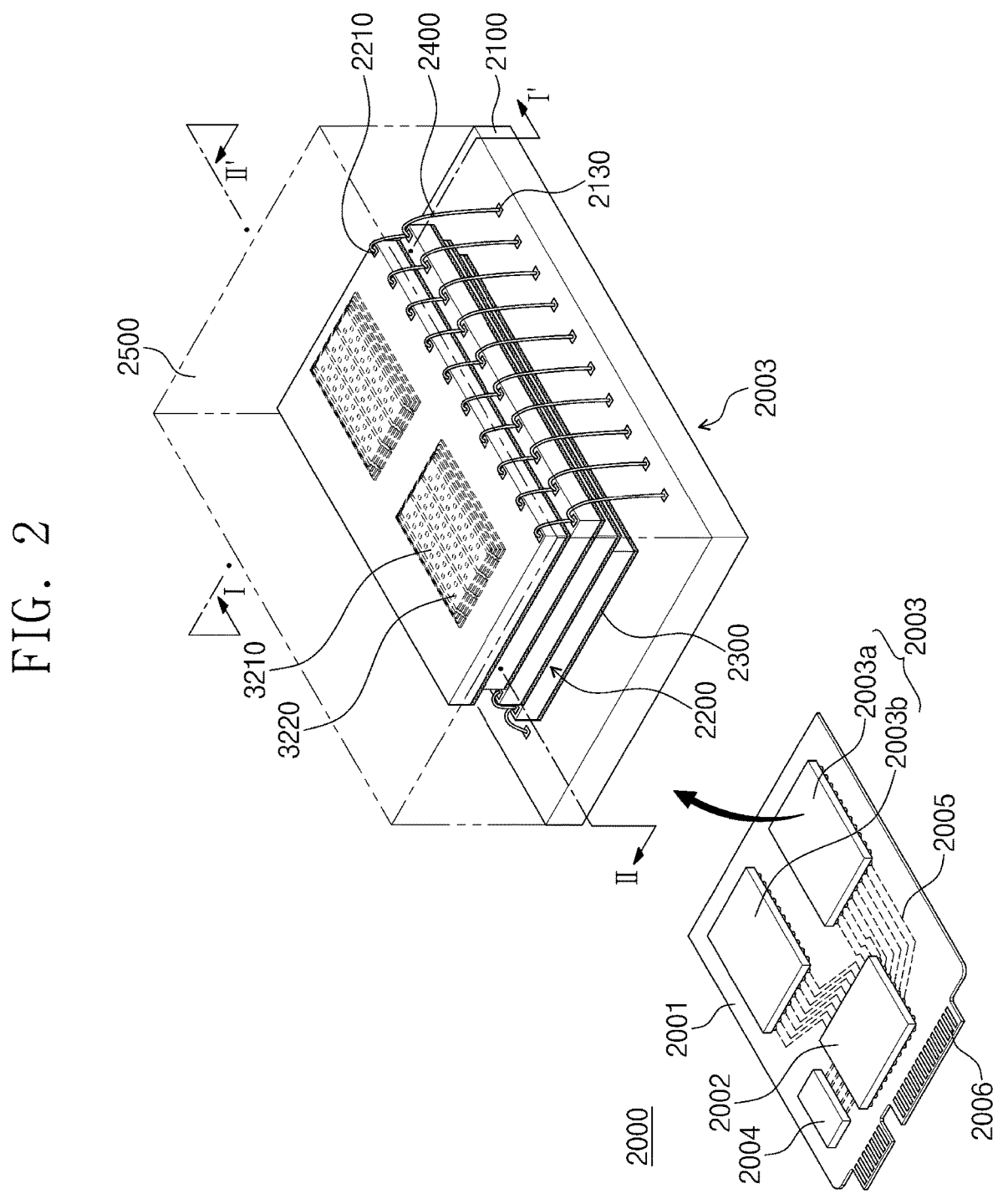

FIG. 2 illustrates a simplified perspective view showing an example of an electronic system that includes a three-dimensional semiconductor memory device.

Referring to FIG. 2, an electronic system 2000 includes a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are coupled to an external host. The number and arrangement of the plurality of pins on the connector 2006 may be changed based on a communication interface between the electronic system 2000 and an external host. The electronic system 2000 may communicate with an external host through one of interfaces, for example, universal serial bus (USB), peripheral component interconnect express (PIC-Express), serial advanced technology attachment (SATA), and M-PHY for universal Flash storage (UFS). For example, the electronic system 2000 may operate with power supplied through the connector 2006 from an external host. The electronic system 2000 may further include a power management integrated circuit (PMIC) that distributes the power supplied from an external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004.

The semiconductor package 2003 may include first and second semiconductor packages 2003*a* and 2003*b* that are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesion layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and memory channel structures 3220. Each of the semiconductor chips 2200 may include a three-dimensional semiconductor memory device which will be discussed below.

The connection structures 2400 may be, for example, bonding wires that electrically connect the input/output pads 2210 to the package upper pads 2130. Therefore, in each of the first and second semiconductor packages 2003*a* and 2003*b*, the semiconductor chips 2200 may be electrically connected to each other in a wire bonding manner, and may be electrically connected to the package upper pads 2130 of the package substrate 2100. In some implementations, on each of the first and second semiconductor packages 2003*a* and 2003*b*, the semiconductor chips 2200 may be electrically connected to each other using through-silicon vias instead of the connection structures 2400 or the bonding wires.

Differently from that shown, the controller 2002 and the semiconductor chips 2200 may be included in a single package. The controller 2002 and the semiconductor chips 2200 may be mounted on a separate interposer substrate other than the main board 2001, and may be connected to each other through connection lines provided in the interposer substrate.

Figure 3:
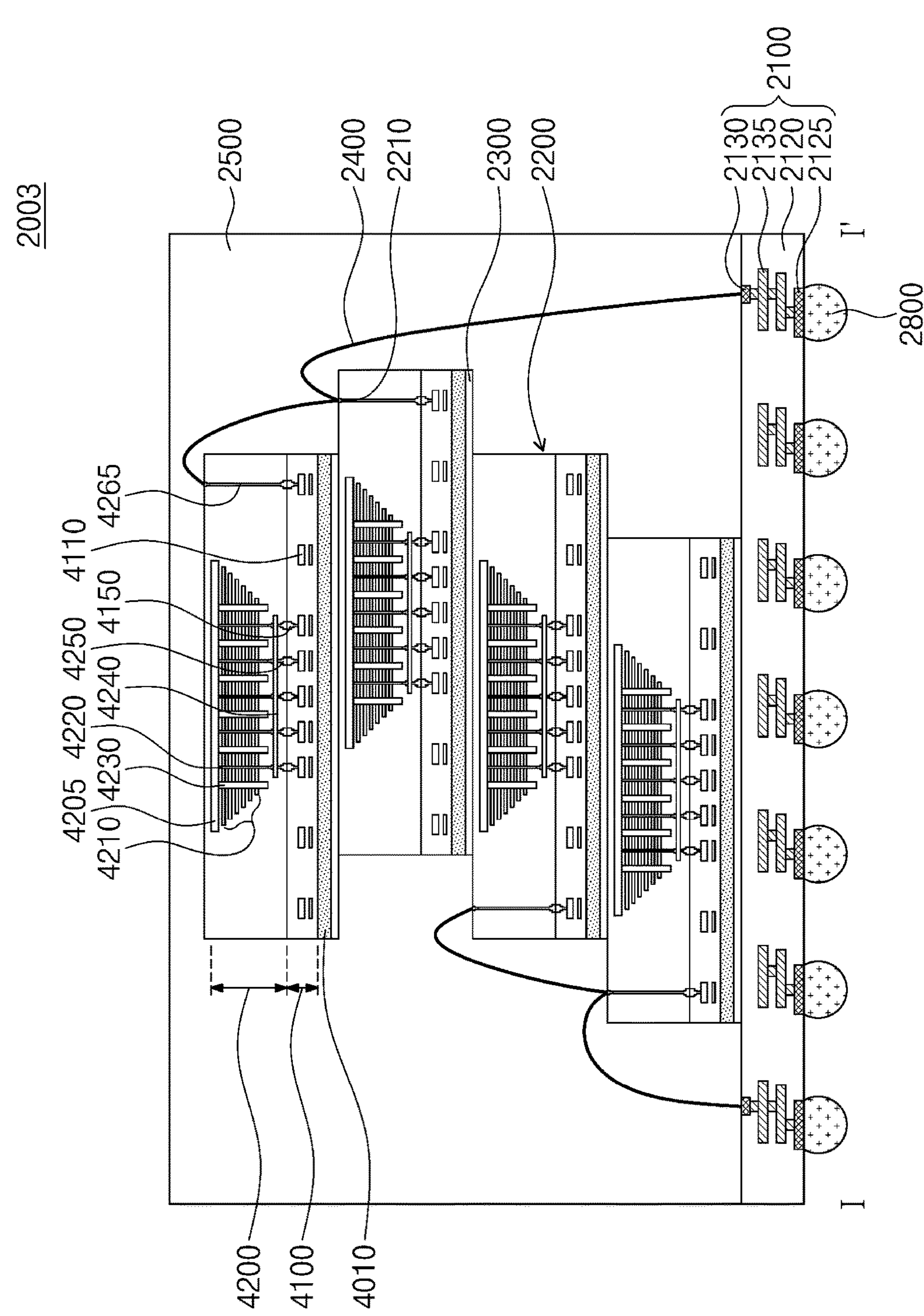
FIGS. 3 and 4 illustrate example cross-sectional views respectively taken along lines I-I' and II-II' of FIG. 2.
Figure 4:
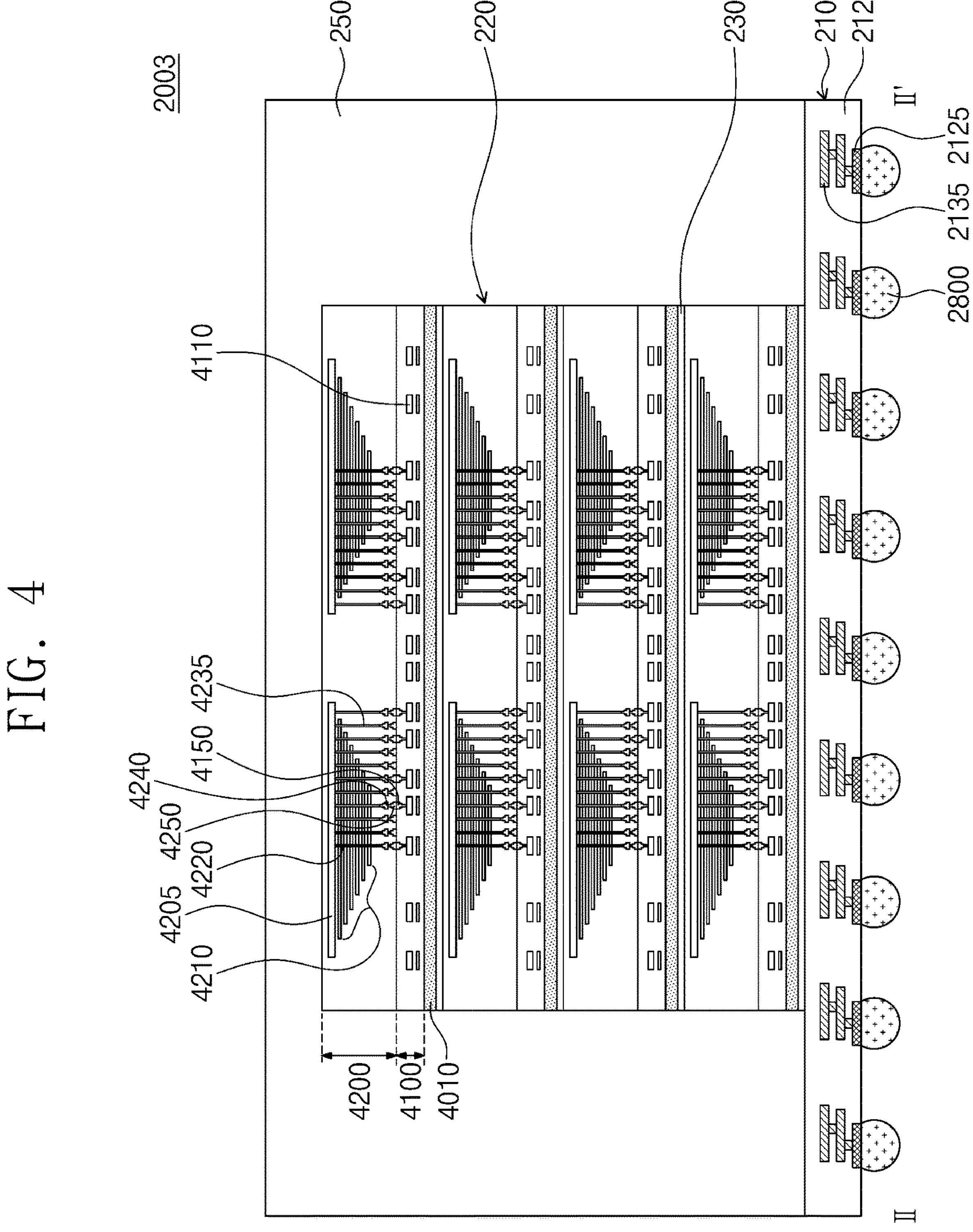

FIGS. 3 and 4 illustrate example cross-sectional views respectively taken along lines I-I' and II-II' of FIG. 2.

Referring to FIGS. 3 and 4, a semiconductor package 2003 includes a package substrate 2100, a plurality of semiconductor chips 2200 on the package substrate 2100, and a molding layer 2500 that covers the package substrate 2100 and the semiconductor chips 2200.

The package substrate 2100 may include a package substrate body 2120, upper pads 2130 disposed or exposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The package upper pads 2130 may be electrically connected to connection structures 2400. The lower pads 2125 may be connected through conductive connectors 2800 to the wiring patterns 2005 in the main board 2001 of the electronic system 2000 depicted in FIG. 2.

Referring to FIGS. 2 and 3, the semiconductor chips 2200 may have sidewalls that are not aligned with each other and also include other sidewalls that are aligned with each other. The semiconductor chips 2200 may be electrically connected to each other thorough the connection structures 2400 shaped like bonding wires. The semiconductor chips 2200 may be configured substantially identical to each other.

Each of the semiconductor chips 2200 may include a semiconductor substrate 4010, a first structure 4100 on the semiconductor substrate 4010, and a second structure 4200 on the first structure 4100. The second structure 4200 and the first structure 4100 may be bonded to each other in a wafer bonding manner.

The first structure 4100 may include peripheral circuit lines 4110 and first bonding pads 4150. The second structure 4200 may include a common source line 4205, a gate stack structure 4210 between the common source line 4205 and the first structure 4100, memory channel structures 4220 and separation structures 4230 that penetrate the gate stack structure 4210, and second bonding pads 4250 that are correspondingly electrically connected to the memory channel structures 4220 and the word lines (see WL of FIG. 1) of the gate stack structure 4210. For example, the second bonding pads 4250 may be electrically connected to the memory channel structures 4220 and the word lines (see WL of FIG. 1) through bit lines 4240 electrically connected to the memory channel structures 4220 and through gate connection lines 4235 electrically connected to the word lines (see WL of FIG. 1). The first bonding pads 4150 of the first structure 4100 may be bonded to and in contact with the second bonding pads 4250 of the second structure 4200. The first and second bonding pads 4150 and 4250 may have their contact portions including, for example, copper (Cu).

Each of the semiconductor chips 2200 may further include input/output pads 2210 and input/output connection lines 4265 below the input/output pads 2210. The input/output connection line 4265 may be electrically connected to one of the second bonding pads 4250 and one of the peripheral circuit lines 4110.

Figure 5:
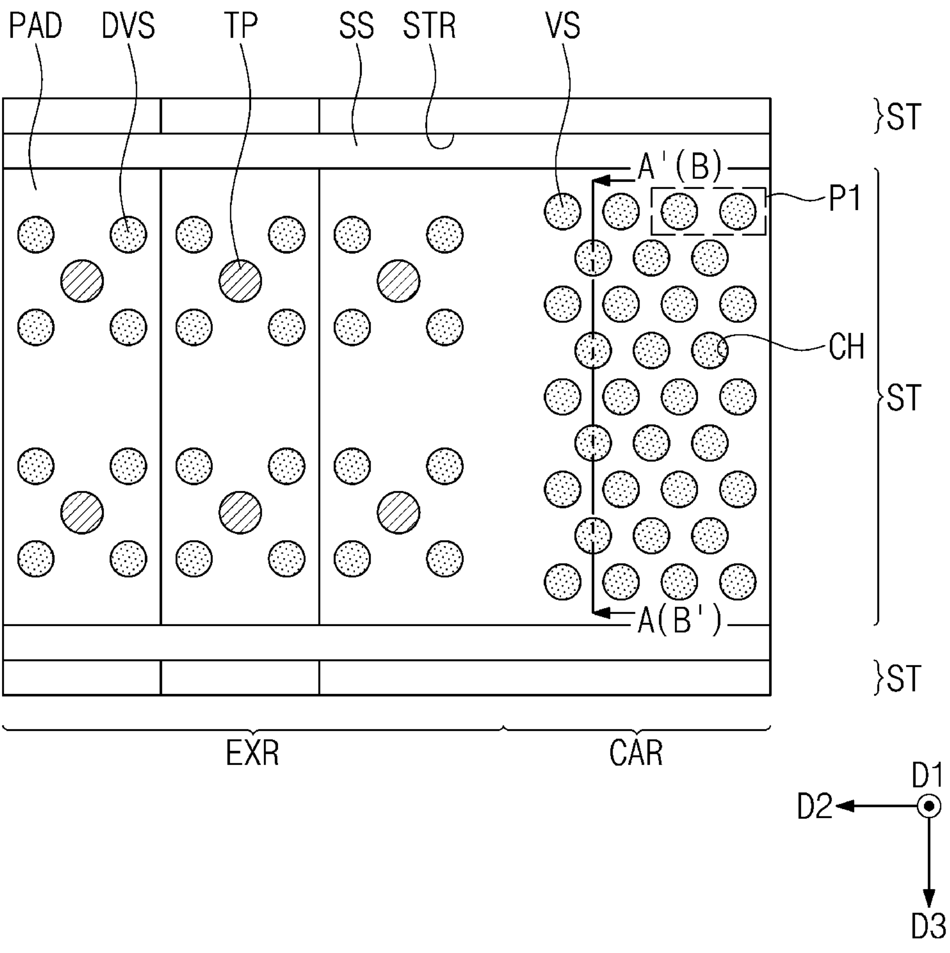
FIG. 5 illustrates a plan view showing an example of a three-dimensional semiconductor memory device.
Figure 6:
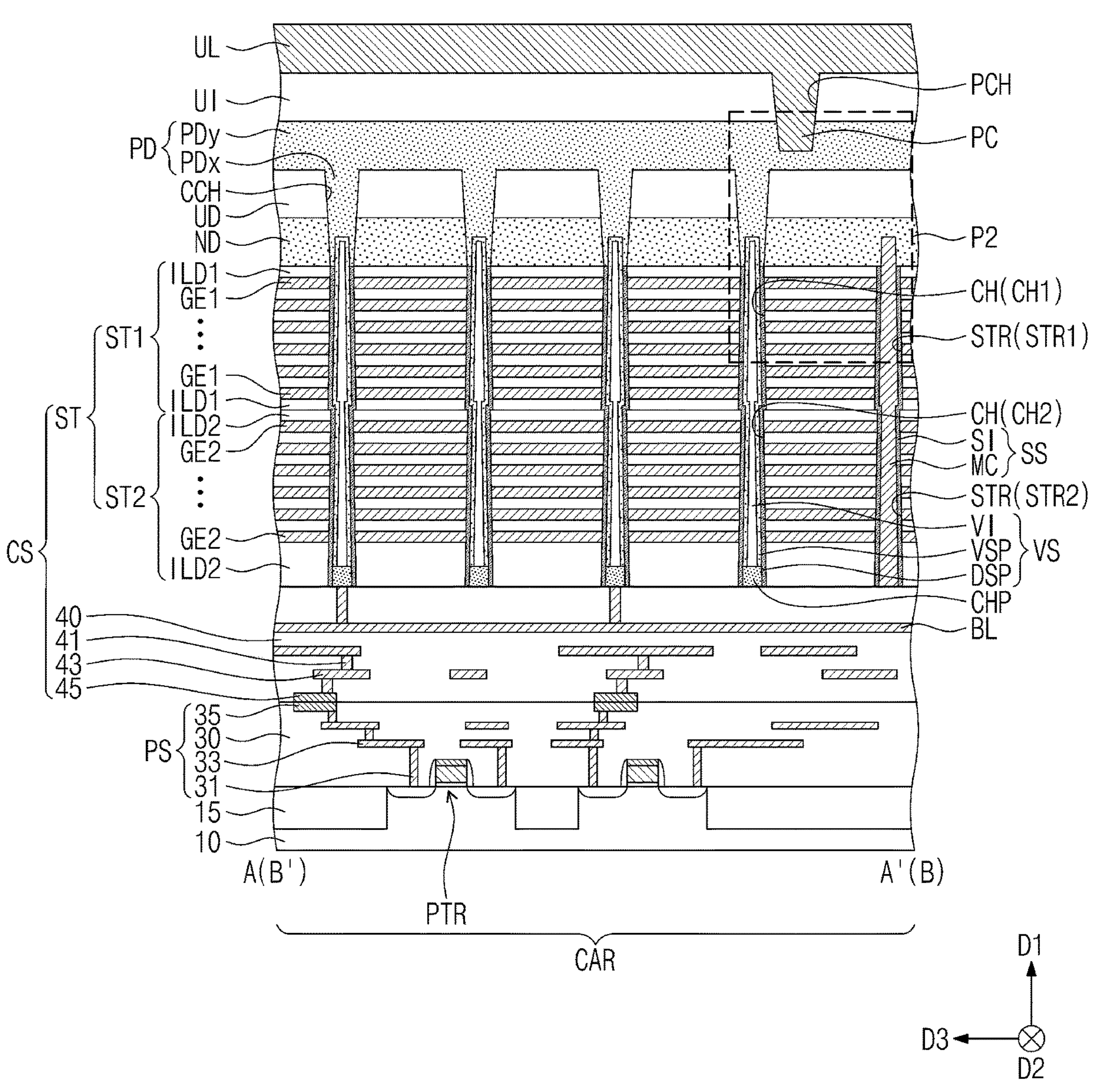
FIG. 6 illustrates an example cross-sectional view taken along lines A-A' and B-B' of FIG. 5.
Figure 7:
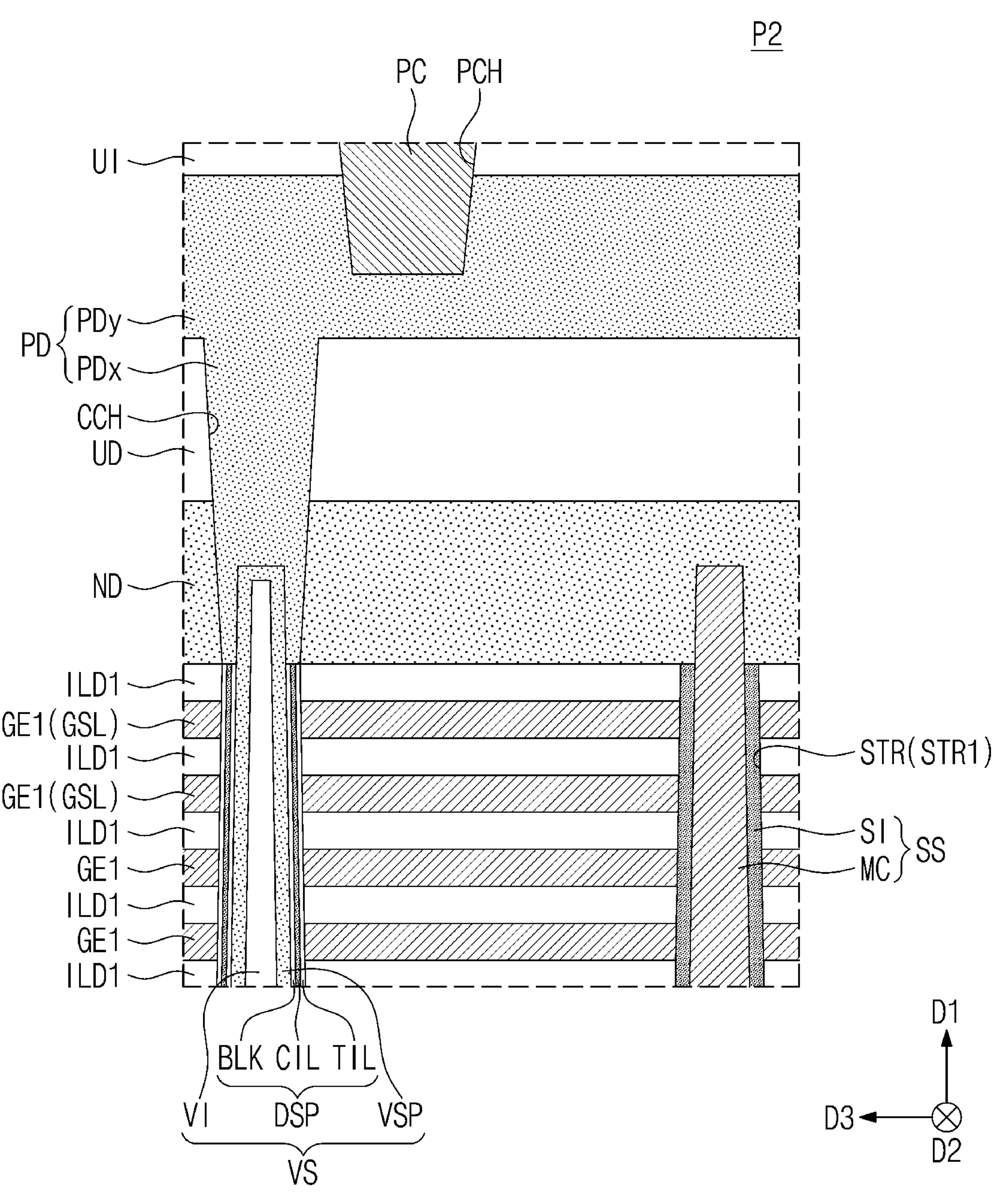
FIGS. 7, 8, 10, and 11 illustrate example enlarged cross-sectional views showing section P2 of FIG. 6.

FIG. 5 illustrates a plan view showing an example of a three-dimensional semiconductor memory device. FIG. 6 illustrates an example cross-sectional view taken along lines A-A' and B-B' of FIG. 5. FIG. 7 illustrates an example enlarged cross-sectional view showing section P2 of FIG. 6.

Referring to FIGS. 5 to 7, a three-dimensional semiconductor memory device includes a peripheral circuit structure PS and a cell array structure CS that are stacked on a peripheral substrate 10. The peripheral substrate 10 may correspond to the semiconductor substrate 4010 of FIGS. 3 and 4. The peripheral circuit structure PS may correspond to the first structure 4100 of FIGS. 3 and 4. The cell array structure CS may correspond to the second structure 4200 of FIGS. 3 and 4.

As the cell array structure CS is bonded onto the peripheral circuit structure PS, it may be possible to increase a cell capacity per unit area of a three-dimensional semiconductor memory device. In addition, as the peripheral circuit structure PS and the cell array structure CS are manufactured independently and then bonded to each other, subsequently described peripheral transistors PTR may be prevented from being damaged due to various heat treatment processes, and accordingly, it may be possible to improve reliability and electrical properties of a three-dimensional semiconductor memory device.

The peripheral substrate 10 may be, for example, a silicon substrate, a silicon-germanium substrate, a germanium substrate, or a monocrystalline epitaxial layer grown on a monocrystalline silicon substrate. The peripheral substrate 10 may have a top surface perpendicular to a first direction D1. The top surface of the peripheral substrate 10 may be parallel to a second direction D2 and a third direction D3 that intersect each other. The first, second, and third directions D1, D2, and D3 may be directions orthogonal to each other. A device isolation layer 15 may be provided in the peripheral substrate 10. The device isolation layer 15 may define an active region of the peripheral substrate 10.

The peripheral circuit structure PS may include peripheral transistors PTR on the peripheral substrate 10, peripheral contact plugs 31, peripheral circuit lines 33 electrically connected through the peripheral contact plugs 31 to the peripheral transistors PTR, first bonding pads 35 electrically connected to the peripheral circuit lines 33, and a first dielectric layer 30 that surrounds the peripheral transistors PTR, the peripheral contact plugs 31, the peripheral circuit lines 33, and the first bonding pads 35. The peripheral transistors PTR may be provided on the active region of the peripheral substrate 10. The peripheral circuit lines 33 may correspond to the peripheral circuit lines 4110 of FIGS. 3 and 4, and the first bonding pads 35 may correspond to the first bonding pads 4150 of FIGS. 3 and 4.

The peripheral contact plugs 31 may each have a width in the second direction D2 or the third direction D3, and for example, the width may increase in the first direction D1. The peripheral contact plugs 31 and the peripheral circuit lines 33 may include a conductive material, such as metal.

The peripheral transistors PTR may constitute, for example, a decoder circuit (see 1110 of FIG. 1), a page buffer (see 1120 of FIG. 1), and a logic circuit (see 1130 of FIG. 1). The peripheral circuit lines 33 and the first bonding pads 35 may be electrically connected through the peripheral contact plugs 31 to the peripheral transistors PTR. Each of the peripheral transistors PTR may be, for example, an NMOS transistor or a PMOS transistor.

The first dielectric layer 30 may be provided on the peripheral substrate 10. On the peripheral substrate 10, the first dielectric layer 30 may cover the peripheral transistors PTR, the peripheral contact plugs 31, and the peripheral circuit lines 33. The first dielectric layer 30 may include a plurality of dielectric layers that constitute a multi-layered structure. For example, the first dielectric layer 30 may include at least one selected from silicon oxide, silicon nitride, silicon oxynitride, and low-k dielectrics. The first dielectric layer 30 may not cover top surfaces of the first bonding pads 35. The first dielectric layer 30 may have a top surface substantially coplanar with those of the first bonding pads 35.

The cell array structure CS may be provided on the peripheral circuit structure PS. The cell array structure CS may include second bonding pads 45, bit lines BL, and a stack structure ST. The second bonding pads 45, the bit lines BL, and the stack structure ST may respectively correspond to the second bonding pads 4250, the bit lines 4240, and the gate stack structure 4210 of FIGS. 3 and 4.

The cell array structure CS may include a cell array area CAR and a cell array extension area EXR. The cell array extension area EXR may extend, from the cell array area CAR, in a second direction D2, a third direction D3, or an opposite direction thereto.

The second bonding pads 45 may be in contact with the first bonding pads 35 of the peripheral circuit structure PS. Cell circuit lines 43 may be electrically connected through cell contact plugs 41 to the second bonding pads 45. A second dielectric layer 40 may surround the cell contact plugs 41, the cell circuit lines 43, and the second bonding pads 45. The second dielectric layer 40, the cell contact plugs 41, the cell circuit lines 43, and the second bonding pads 45 may be provided on the first dielectric layer 30. The second dielectric layer 40 may include a plurality of dielectric layers that constitute a multi-layered structure. For example, the second dielectric layer 40 may include at least one selected from silicon oxide, silicon nitride, silicon oxynitride, and low-k dielectrics.

The cell contact plugs 41 may each have a width in the second direction D2 and the third direction D3, and for example, the width may decrease in the first direction D1. The cell contact plugs 41 and the cell circuit lines 43 may include a conductive material, such as metal.

Some of the cell contact plugs 41 may connect the bit lines BL to vertical structures VS which will be discussed below. The bit lines BL may extend, for example, in the third direction D3 and may be spaced apart from each other in the second direction D2. The bit lines BL may include a conductive material, such as metal.

The second dielectric layer 40 may not cover bottom surfaces of the second bonding pads 45. The second dielectric layer 40 may have a bottom surface substantially coplanar with those of the second bonding pads 45. The bottom surfaces of the second bonding pads 45 may be correspondingly in direct contact with the top surfaces of the first bonding pads 35. The first and second bonding pads 35 and 45 may include metal, such as copper (Cu), tungsten (W), aluminum (Al), nickel (Ni), or tin (Sn). For example, the first and second bonding pads 35 and 45 may include copper (Cu). The first bonding pad 35 and the second bonding pad 45 may constitute a single unitary shape with no interface therebetween. Although the first and second bonding pads 35 and 45 are illustrated to have their sidewalls aligned with each other, the present disclosure is not limited thereto, and when viewed in plan, the first and second bonding pads 35 and 45 may have their sidewalls spaced apart from each other.

The stack structure ST and a third dielectric layer may be provided on the second dielectric layer 40. The third dielectric layer may surround the stack structure ST. The third dielectric layer may include a plurality of dielectric layers having a multi-layered structure. The third dielectric layer may include at least one selected from silicon oxide, silicon nitride, silicon oxynitride, and low-k dielectrics. For example, the third dielectric layer may include high density plasma (HDP) oxide or tetraethylorthosilicate (TEOS).

The stack structure ST may be provided in plural. For example, when viewed in plan, the plurality of stack structures ST may extend in the second direction D2 and may be spaced apart from each other in the third direction D3. A subsequently described separation trench STR may separate the stack structures ST from each other in the third direction D3. For convenience of discussion, the following will focus on a single stack structure ST, and a description below may be identically applicable to other stack structures ST.

The stack structure ST may include a first stack structure ST1 and a second stack structure ST2. The first stack structure ST1 may include first interlayer dielectric layers ILD1 and first gate electrodes GE1 that are alternately stacked, and the second stack structure ST2 may include second interlayer dielectric layers ILD2 and second gate electrodes GE2 that are alternately stacked (see FIGS. 6A to 6C).

The first stack structure ST1 may be provided on the peripheral substrate 10, and the second stack structure ST2 may be provided between the first stack structure ST1 and the peripheral substrate 10. For example, the second stack structure ST2 may be provided on a bottom surface of a lowermost one of the first interlayer dielectric layers ILD1 of the first stack structure ST1. An uppermost one of the second interlayer dielectric layers ILD2 of the second stack structure ST2 may be in contact with the lowermost first interlayer dielectric layer ILD1 of the first stack structure ST1, but the present disclosure is not limited thereto. For example, a single interlayer dielectric layer may be provided between an uppermost one of the second gate electrodes GE2 of the second stack structure ST2 and the first gate electrodes GE1 of the first stack structure ST1.

The first and second gate electrodes GE1 and GE2 may include, for example, at least one selected from doped semiconductors (e.g., doped silicon), metals (e.g., tungsten, copper, or aluminum), conductive metal nitrides (e.g., titanium nitride or tantalum nitride), and transition metals (e.g., titanium or tantalum). The first and second interlayer dielectric layers ILD1 and ILD2 may include at least one selected from silicon oxide, silicon nitride, silicon oxynitride, and low-k dielectrics. For example, the first and second interlayer dielectric layers ILD1 and ILD2 may include high density plasma (HDP) oxide or tetraethylorthosilicate (TEOS).

Although not shown, a third stack structure may further be provided between the second stack structure ST2 and the peripheral substrate 10. The third stack structure may have features the same as or similar to those of the first stack structure ST1 and the second stack structure ST2.

Although not shown, when viewed in cross section, the stack structure ST may have a stepwise structure along the second direction D2 on the cell array extension area EXR. For example, a thickness in the first direction D1 of the stack structure ST on the cell array extension area EXR may decrease with increasing distance from the cell array area CAR. The first and second gate electrodes GE1 and GE2 may have their lengths in the second direction D2 that increase with increasing distance from the peripheral substrate 10. A lowermost second gate electrode GE2 of the first and second gate electrodes GE1 and GE2 may have a minimum length, and an uppermost first gate electrode GE1 of the first and second gate electrodes GE1 and GE2 may have a maximum length. When viewed in plan, sidewalls of the first and second gate electrodes GE1 and GE2 may be spaced apart in the second direction D2 from each other at a certain interval. Each of the first and second gate electrodes GE1 and GE2 may include a pad portion PAD or an end in the second direction D2. The pad portion PAD may be a segment of each of the first and second gate electrodes GE1 and GE2 that constitute the stepwise structure of the stack structure ST. A through plug TP may extend in the first direction D1 and may be electrically connected to the pad portion PAD.

One or more of the first gate electrodes GE1 may be ground selection lines GSL. The ground selection line GSL may control a ground selection transistor of eth first transistors LT1 and LT2 discussed with reference to FIG. 1. For example, the ground selection line GSL may be positioned in an upper portion of the stack structure ST. Channel holes CH may penetrate the cell array structure CS on the cell array area CAR and the cell array extension area EXR. Each of the channel holes CH may penetrate in the first direction D1 through at least one selected from the stack structure ST and the third dielectric layer. For example, each of the channel holes CH may include a first channel hole CH1 that penetrates the first stack structure ST1 and a second channel hole CH2 that penetrates the second stack structure ST2. Each of the first and second channel holes CH1 and CH2 may have a width in the second direction D2 and/or the third direction D3, and the width may decrease with increasing distance from the peripheral substrate 10. The first and second channel holes CH1 and CH2 may be connected to each other, and may have different diameters at their connection boundary. For example, a diameter at an upper portion of the second channel hole CH2 may be less than a diameter at a lower portion of the second channel hole CH2. The first and second channel holes CH1 and CH2 may have a step difference at their connection boundary. The present disclosure, however, is not limited thereto, and differently from that shown, three or more channel holes may be provided which have a step difference at each of two or more their boundaries. Alternatively, differently from that shown, channel holes may be provided which have flat sidewalls with no step difference.

On the cell array area CAR, vertical structures VS may penetrate in the first direction D1 through the stack structure ST and may fill the channel holes CH. The vertical structures VS may correspond to the memory channel structures 4220 of FIGS. 3 and 4. A channel pad CHP may be provided on a lower portion of the vertical structure VS. The vertical structures VS may be electrically connected through the channel pads CHP to the cell contact plugs 41 and the bit lines BL. On the cell array extension area EXR, dummy vertical structures DVS may penetrate in the first direction D1 through at least one selected from the stack structure ST and the third dielectric layer, and may fill the channel holes CH. The vertical structure VS and the dummy vertical structure DVS may each have a bottom surface that has, for example, a circular shape, an oval shape, or a bar shape.

Each of the vertical structures VS may include a data storage pattern DSP that conformally covers an inner sidewall of the channel hole CH, a vertical semiconductor pattern VSP that conformally covers an inner sidewall of the data storage pattern DSP, and a buried dielectric pattern VI that is surrounded by the vertical semiconductor pattern VSP and the channel pad CHP and fills an inner space of the channel hole CH. The vertical semiconductor pattern VSP may be provided between the data storage pattern DSP and the buried dielectric pattern VI. The vertical semiconductor pattern VSP may have a macaroni shape or a pipe shape whose top end is closed. The data storage pattern DSP may have a pipe shape whose top end is opened. The vertical semiconductor pattern VSP may include, for example, an impurity-doped semiconductor material, an impurity-undoped intrinsic semiconductor material, or a polycrystalline semiconductor material. The channel pad CHP may include, for example, an impurity-doped semiconductor material or a conductive material.

The data storage pattern DSP may include a blocking dielectric layer BLK, a charge storage layer CIL, and a tunneling dielectric layer TIL that are sequentially stacked on the inner sidewall of the channel hole CH (see FIG. 7). The charge storage layer CIL may be interposed between the blocking dielectric layer BLK and the tunneling dielectric layer TIL. Between the stack structure ST and the vertical semiconductor pattern VSP, the blocking dielectric layer BLK, the charge storage layer CIL, and the tunneling dielectric layer TIL may extend along the inner sidewall of the channel hole CH. The data storage pattern DSP may not cover an upper portion of the vertical semiconductor pattern VSP in a channel contact hole CCH which will be discussed below.

The data storage pattern DSP may store and/or change data by using Fowler-Nordheim tunneling induced by a voltage difference between the vertical semiconductor pattern VSP and the first and second gate electrodes GE1 and GE2. For example, the blocking dielectric layer BLK and the tunneling dielectric layer TIL may include silicon oxide, and the charge storage layer CIL may include at least one selected from silicon nitride and silicon oxynitride.

An n-doped pattern ND may be provided on the stack structure ST. The n-doped pattern ND may cover the stack structure ST. The n-doped pattern ND may cover an uppermost one of the first interlayer dielectric layers ILD1. The n-doped pattern ND may be provided on the cell array area CAR. For example, although not shown, the n-doped pattern ND may further be provided on the cell array extension area EXR. The n-doped pattern ND may include a semiconductor material doped with n-type impurities. The n-doped pattern ND may include polysilicon doped with n-type impurities.

A undoped pattern UD may be provided on the n-doped pattern ND. The undoped pattern UD may cover the n-doped pattern ND. The undoped pattern UD may be provided on the cell array area CAR. For example, although not shown, the undoped pattern UD may further be provided on the cell array extension area EXR. The undoped pattern UD may include a semiconductor material doped with either no impurities or a small amount of impurities. For example, the undoped pattern UD may include polysilicon doped with no impurities. For another example, the undoped pattern UD may include polysilicon doped with impurities whose amount is less than that of impurities doped into polysilicon in the n-doped pattern ND and a p-doped pattern PD which will be discussed below. In this case, impurities in the undoped pattern UD may be ones diffused from the n-doped pattern ND or a p-doped pattern PD which will be discussed below, and thus the undoped pattern UD may include impurities whose amount is relatively small.

A channel contact hole CCH may be provided in the n-doped pattern ND and the undoped pattern UD. The channel contact hole CCH may extend along the first direction D1 in the n-doped pattern ND and the undoped pattern UD. Each of a plurality of channel contact holes CCH may be provided on and vertically overlap a corresponding vertical structure VS.

The vertical structure VS may extend into the n-doped pattern ND, and an upper portion of the vertical structure VS may be positioned in the channel contact hole CCH. For example, the vertical semiconductor pattern VSP and the buried dielectric pattern VI may extend into the n-doped pattern ND, and may have their upper portions positioned in the channel contact hole CCH. In the channel contact hole CCH, the upper portion of the vertical semiconductor pattern VSP may surround the upper portion of the buried dielectric pattern VI. In the channel contact hole CCH, the upper portion of the vertical semiconductor pattern VSP may be in contact with a p-doped pattern PD which will be discussed below. For example, the upper portion of the vertical semiconductor pattern VSP may include p-type impurities.

A p-doped pattern PD may be provided on the undoped pattern UD. The p-doped pattern PD may cover the undoped pattern UD. The p-doped pattern PD may be provided on the cell array area CAR. For example, although not shown, the p-doped pattern PD may further be provided on the cell array extension area EXR. The p-doped pattern PD may include a semiconductor material doped with p-type impurities. For example, the p-doped pattern PD may include polysilicon doped with p-type impurities.

The p-doped pattern PD may include a p-doped horizontal pattern PDy and a p-doped vertical pattern PDx. The p-doped horizontal pattern PDy may cover the undoped pattern UD. The p-doped vertical pattern PDx may extend from the vertical structure VS toward the p-doped horizontal pattern PDy. The p-doped vertical pattern PDx may penetrate the undoped pattern UD and the n-doped pattern ND and may fill the channel contact hole CCH. In the channel contact hole CCH, the p-doped vertical pattern PDx may be in contact with the vertical structure VS. For example, in the channel contact hole CCH, the p-doped vertical pattern PDx may be in contact with an upper portion of the vertical semiconductor pattern VSP and may be electrically connected to the vertical semiconductor pattern VSP. The p-doped vertical pattern PDx and the vertical semiconductor pattern VSP may be in contact with each other with no boundary.

The undoped pattern UD may be interposed between the p-doped pattern PD and the n-doped pattern ND. For example, the undoped pattern UD may be interposed between the p-doped horizontal pattern PDy and the n-doped pattern ND, and may extend in the second direction D2 and the third direction D3. The undoped pattern UD may separate the p-doped horizontal pattern PDy and the n-doped pattern ND from each other. As the undoped pattern UD separates the p-doped horizontal pattern PDy and the n-doped pattern ND from each other, a junction leakage may be minimized between the p-doped pattern PD and the n-doped pattern ND. In conclusion, a three-dimensional semiconductor memory device may improve in reliability and electrical properties.

In a data erase operation of a three-dimensional semiconductor memory device, the p-doped pattern PD may be used as a path along which holes are provided to the vertical structure VS. An erase operation on a plurality of memory cell transistors MCT may be simultaneously performed through the p-doped pattern PD. Therefore, a three-dimensional semiconductor memory device may have an increased speed of erase operation and accordingly may have improved performance.

The separation trench STR may extend in the second direction D2. The separation trench STR may separate the stack structures ST from each other in the third direction D3. The separation trench STR may extend from the cell array area CAR toward the cell array extension area EXR.

The separation trench STR may include a first separation trench STR1 that penetrates the first stack structure ST1 and a second separation trench STR2 that penetrates the second stack structure ST2. Each of the first and second separation trenches STR1 and STR2 may have a width in the second direction D2 and/or the third direction D3, and the width may decrease with increasing distance from the peripheral substrate 10. The first and second separation trenches STR1 and STR2 may be connected to each other, and may have different widths at their connection boundary. For example, a diameter at an upper portion of the second separation trench STR2 may be less than a diameter at a lower portion of the first separation trench STR1. The first and second separation trenches STR1 and STR2 may have a step difference at their connection boundary. The present disclosure, however, is not limited thereto, and differently from that shown, three or more separation trenches may be provided which have a step difference at each of two or more their boundaries. Alternatively, differently from that shown, separation trenches may be provided which have flat sidewalls with no step difference.

A separation pattern SS may fill the separation trench STR. The separation pattern SS may correspond to the separation structures 4230 of FIGS. 3 and 4. A sidewall of the separation pattern SS may be in contact with the first and second gate electrodes GE1 and GE2 and one or more of the first and second interlayer dielectric layers ILD1 and ILD2. The separation pattern SS may be provided between a plurality of stack structures ST, and may separate the stack structures ST from each other in the third direction D3.

The separation pattern SS may include a metal contact MC that extends in the first direction D1 between neighboring stack structures ST, and may also include a separation dielectric pattern SI between the metal contact MC and the stack structure ST. The metal contact MC may further extend into and contact the n-doped pattern ND. The separation dielectric pattern SI may separate the metal contact MC from the stack structure ST. The metal contact MC may extend in the first direction D1 more than the separation dielectric pattern SI. The metal contact MC may include a conductive material, such as metal. The separation dielectric pattern SI may include at least one selected from silicon oxide, silicon nitride, silicon oxynitride, and low-k dielectrics.

The metal contact MC may be electrically connected to the n-doped pattern ND. An electron may be provided from the metal contact MC through the n-doped pattern ND to the vertical structure VS.

An upper dielectric layer UI may be provided on the p-doped pattern PD. A p-contact hole PCH may be provided in the upper dielectric layer UI and the p-doped pattern PD. The p-contact hole PCH may extend from a top surface of the upper dielectric layer UI to an upper portion of the p-doped pattern PD. A p-contact plug PC may fill the p-contact hole PCH. The p-contact plug PC may be electrically connected to the p-doped pattern PD. An upper circuit line UL may be provided on the upper dielectric layer UI and the p-contact plug PC. The upper circuit line UL may be electrically connected through the p-contact plug PC to the p-doped pattern PD. The upper circuit line UL may electrically control the p-doped pattern PD. The p-contact plug PC and the upper circuit line UL may include a conductive material, such as metal.

With reference to FIGS. 8 to 16, the following will describe various implementations of a three-dimensional semiconductor memory device. For brevity of description, a repetitive description will be omitted.

Figure 8:
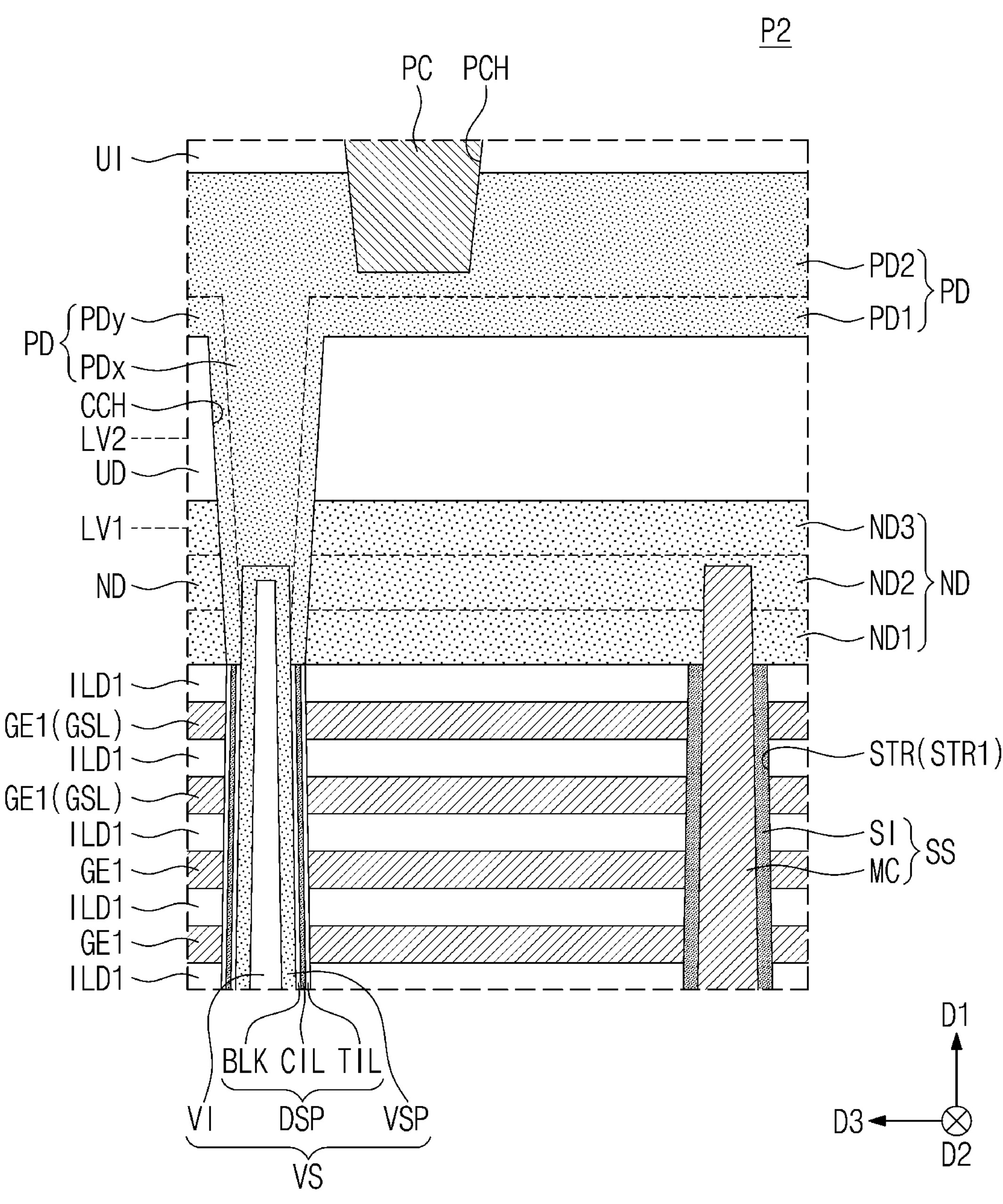
Figure 9A:
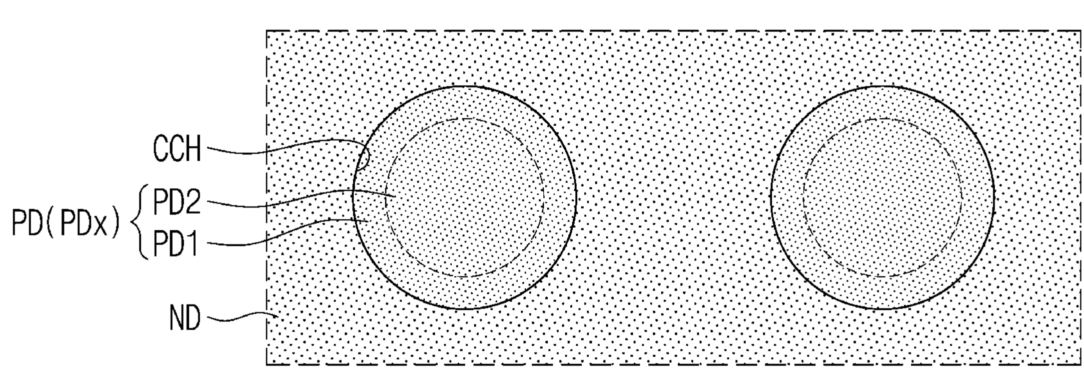
FIGS. 9A and 9B illustrate example enlarged plan views showing section P1 respectively at a first level and a second level of FIG. 5.
Figure 9B:
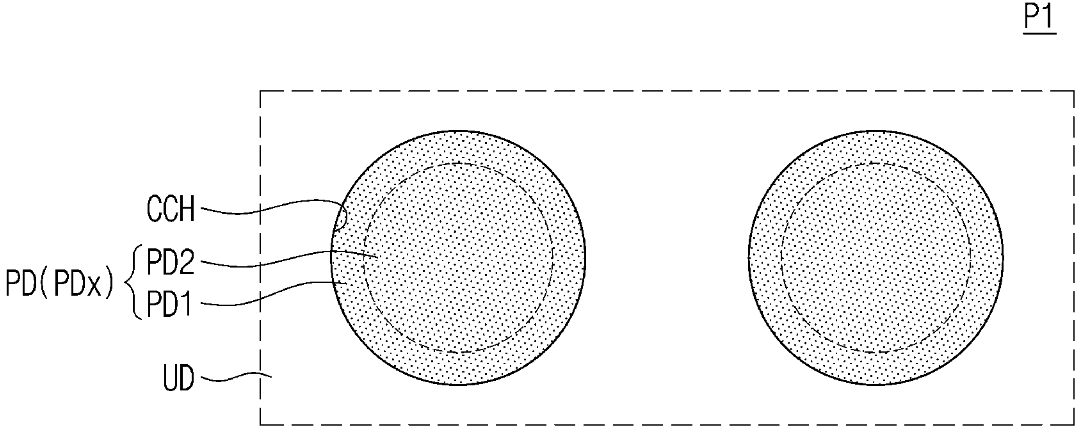
Figure 10:
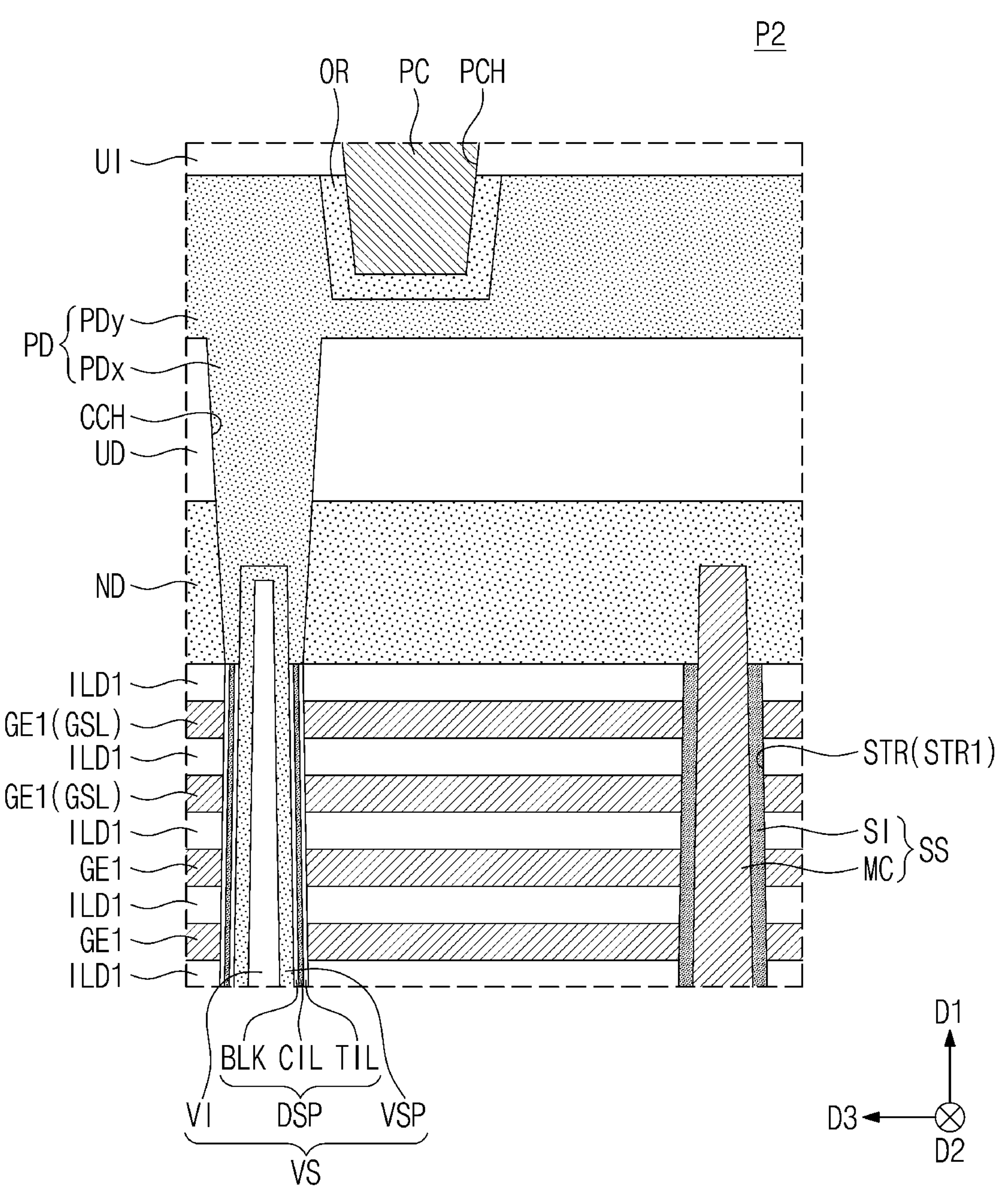
Figure 11:
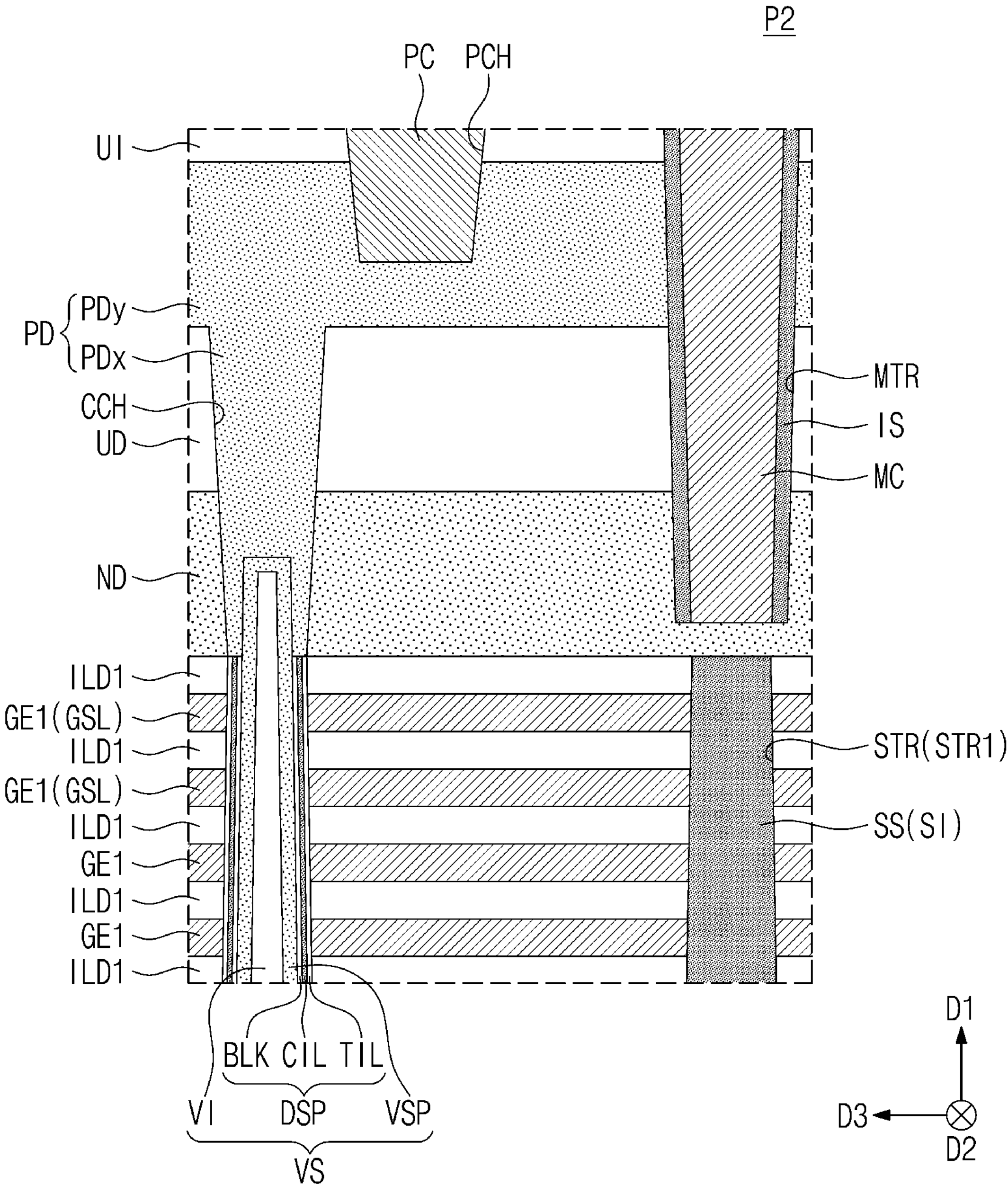
Figure 12:
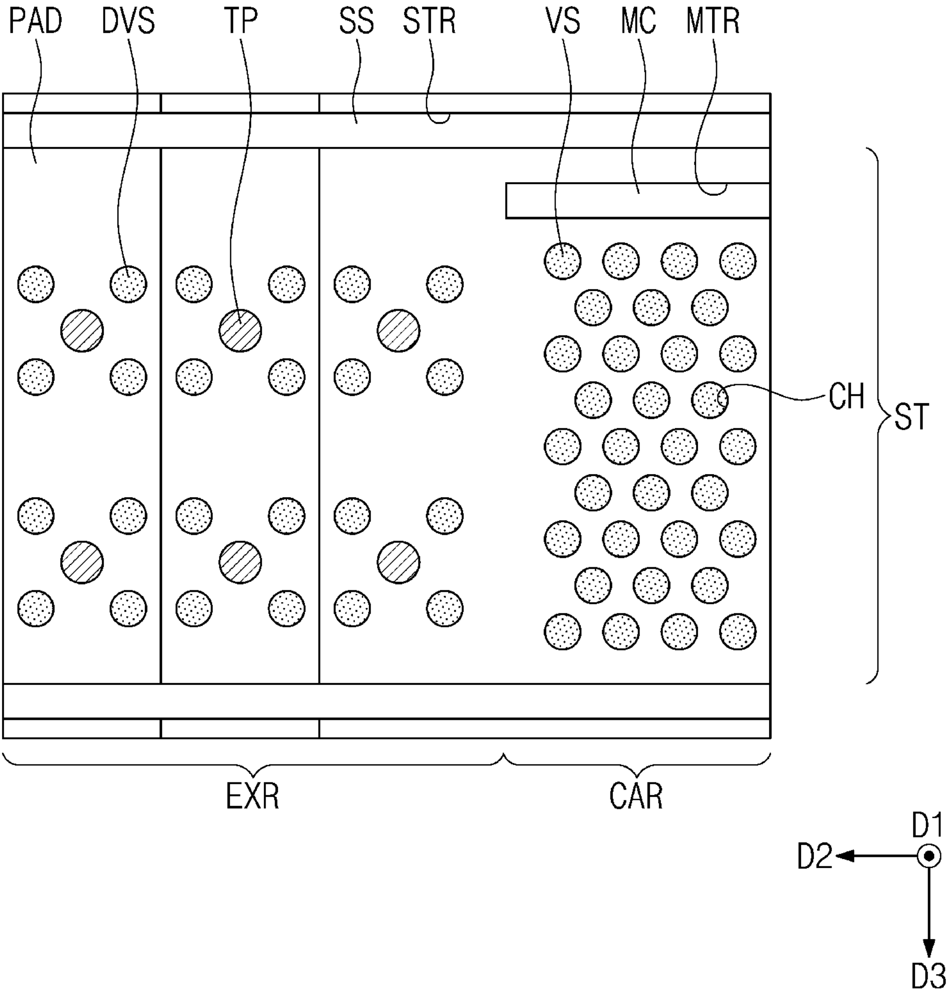
FIG. 12 illustrates a plan view showing another example of a three-dimensional semiconductor memory device.

FIGS. 8, 10, and 11 illustrate example enlarged cross-sectional views showing section P2 of FIG. 6. FIGS. 9A and 9B illustrate example enlarged plan views showing section P1 respectively at a first level and a second level of FIG. 5. FIG. 12 illustrates a plan view showing another example of a three-dimensional semiconductor memory device.

Referring to FIGS. 8 to 9B, the n-doped pattern ND and the p-doped pattern PD each has a doping concentration that is changed in accordance with regions. In this description, the doping concentration of the n-doped pattern ND indicates an n-type impurity concentration, and the doping concentration of the p-doped pattern PD indicates a p-type impurity concentration.

The doping concentration of the n-doped pattern ND may be changed in a downward direction. For example, the doping concentration of the n-doped pattern ND may increase continuously or discontinuously in a downward direction. In this description, the phrase "a doping concentration is discontinuously changed" may be defined to include a case where there is a relatively large change in doping concentration even if the doping concentration is continuous.

The doping concentration of the n-doped pattern ND may decrease with decreasing distance from the undoped pattern UD. For example, the n-doped pattern ND may include a first n-doped region ND1, a second n-doped region ND2, and a third n-doped region ND3 that are sequentially defined from a lower portion thereof. The second n-doped region ND2 may have a doping concentration less than that of the first n-doped region ND1 and greater than that of the third n-doped region ND3. For example, in a direction directed from the first n-doped region ND1 to the second n-doped region ND2 or from the second n-doped region ND2 to the third n-doped region ND3, the doping concentration may discontinuously decrease at a boundary between the first n-doped region ND1 and the second n-doped region ND2 or between the second n-doped region ND2 and the third n-doped region ND3. For another example, the third n-doped region ND3 may not be defined. For another example, a fourth n-doped region may further be defined.

The doping concentration of the p-doped pattern PD may be changed with decreasing distance from the undoped pattern UD or the n-doped pattern ND. A doping concentration of the p-doped horizontal pattern PDy may decrease continuously or discontinuously in a downward direction. A doping concentration of the p-doped vertical pattern PDx may continuously or discontinuously decrease with decreasing distance from an inner sidewall of the channel contact hole CCH.

The p-doped pattern PD may include a first p-doped region PD1 and a second p-doped region PD2 whose doping concentration is greater than that of the first p-doped region PD1. The first p-doped region PD1 may be defined on an inner sidewall of the channel contact hole CCH and a top surface of the undoped pattern UD. The second p-doped region PD2 may fill the channel contact hole CCH, and on the top surface of the undoped pattern UD, the second p-doped region PD2 may cover the first p-doped region PD1. For example, in a direction directed from the second p-doped region PD2 to the first p-doped region PD1, the doping concentration may discontinuously decrease at a boundary between the second p-doped region PD2 and the first p-doped region PD1. For another example, the third a third p-doped region may further be defined.

A lower portion of the p-doped vertical pattern PDx may be surrounded by the n-doped pattern ND, and for example, at a first level LV1, the p-doped vertical pattern PDx may be surrounded by the n-doped pattern ND. An upper portion of the p-doped vertical pattern PDx may be surrounded by the undoped pattern UD, and for example, at a second level LV2, the p-doped vertical pattern PDx may be surrounded by the undoped pattern UD.

When viewed in plan, a doping concentration at a lower portion of the p-doped vertical pattern PDx may continuously or discontinuously decrease with decreasing distance from the n-doped pattern ND (see FIG. 9A). For example, at the first level LV1, the second p-doped region PD2 may fill the channel contact hole CCH, and the first p-doped region PD1 may be provided between the second p-doped region PD2 and the n-doped pattern ND. In a direction directed from the second p-doped region PD2 to the first p-doped region PD1, the doping concentration at the lower portion of the p-doped vertical pattern PDx may discontinuously decrease at a boundary between the second p-doped region PD2 and the first p-doped region PD1.

When viewed in plan, a doping concentration at an upper portion of the p-doped vertical pattern PDx may continuously or discontinuously decrease with decreasing distance from the undoped pattern UD (see FIG. 9B). For example, at the second level LV2, the second p-doped region PD2 may fill the channel contact hole CCH, and the first p-doped region PD1 may be provided between the second p-doped region PD2 and the undoped pattern UD. In a direction directed from the second p-doped region PD2 to the first p-doped region PD1, the doping concentration at the upper portion of the p-doped vertical pattern PDx may discontinuously decrease at a boundary between the second p-doped region PD2 and the first p-doped region PD1.

The doping concentration of each of the n-doped and p-doped patterns ND and PD may be adjusted to minimize a junction leakage between the n-doped and p-doped patterns ND and PD. In conclusion, a three-dimensional semiconductor memory device may improve in reliability and electrical properties.

Referring to FIG. 10, the p-doped pattern PD may include an ohmic region OR. The ohmic region OR may include n-type impurities. The ohmic region OR may be adjacent to the p-contact plug PC. For example, the ohmic region OR may be provided along an outer wall of the p-contact hole PCH. The p-contact plug PC and the p-doped pattern PD may constitute an ohmic junction through the ohmic region OR. An n-doping concentration of the ohmic region OR may be changed in accordance with regions, but the present disclosure is not limited thereto.

Referring to FIGS. 11 and 12, the metal contact MC is provided as a discrete component from the separation pattern SS. For example, the separation pattern SS does not include the metal contact MC.

Referring to FIG. 11, a metal contact trench MTR penetrates the p-doped pattern PD and the undoped pattern UD, and extends into the n-doped pattern ND. The metal contact MC fills the metal contact trench MTR. The metal contact MC is in contact with and electrically connected to the n-doped pattern ND. For example, a dielectric spacer IS is further provided on an inner sidewall of the metal contact trench MTR. The dielectric spacer IS separates the metal contact MC from the p-doped pattern PD and the undoped pattern UD.

Referring to FIG. 12, when viewed in plan, the metal contact MC is spaced apart from the separation pattern SS. For example, the metal contact MC extends into the n-doped pattern ND from the stack structure ST. For another example, the metal contact MC extends into the n-doped pattern ND from the p-doped pattern PD and the undoped pattern UD. The metal contact MC is illustrated to have a linear shape when viewed in plan, but the present disclosure is not limited thereto.

Figure 13:
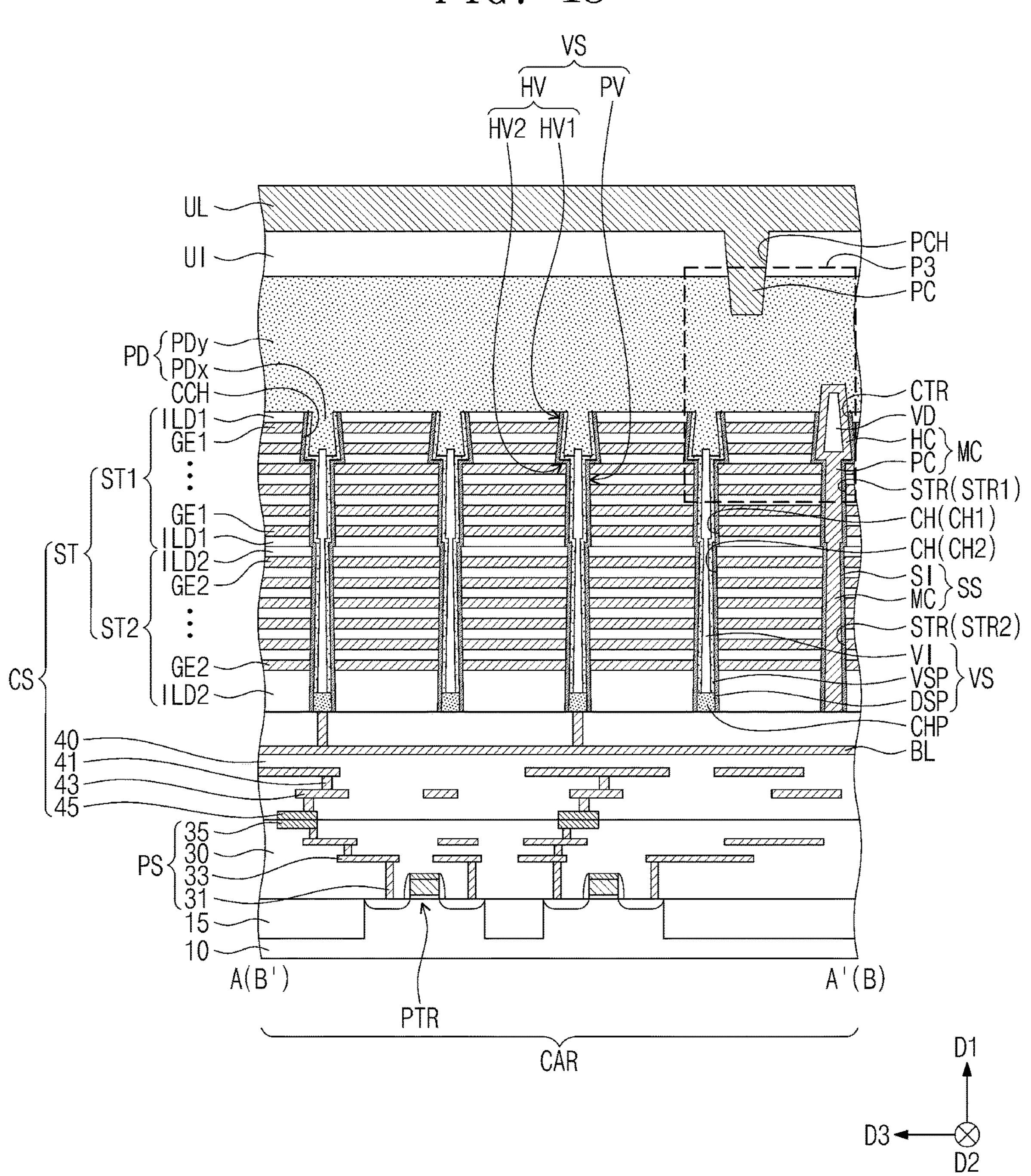
FIG. 13 illustrates an example cross-sectional view taken along lines A-A' and B-B' of FIG. 5.
Figure 14:
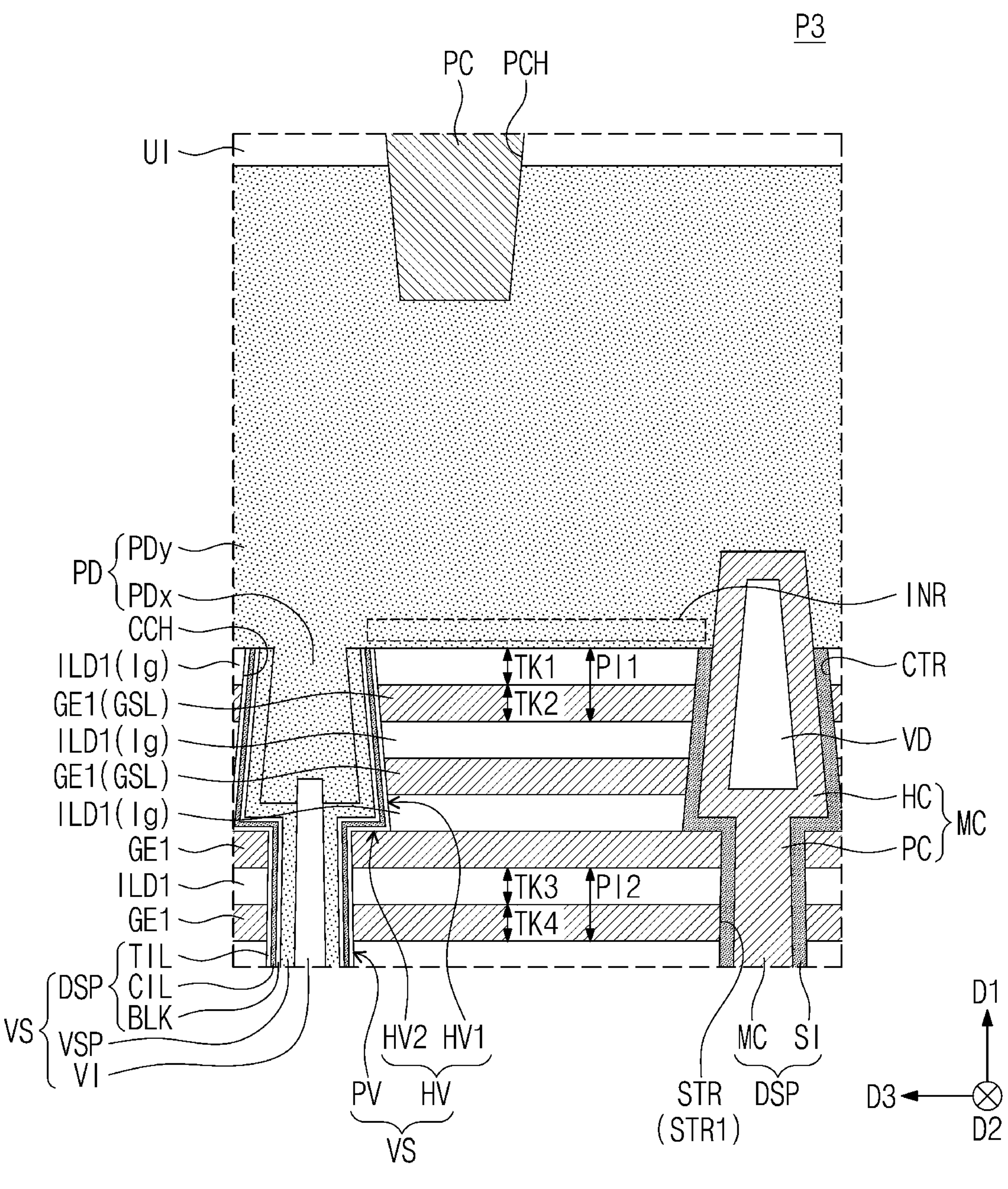
FIGS. 14 to 16 illustrate example enlarged cross-sectional views showing section P3 of FIG. 13.
Figure 15:
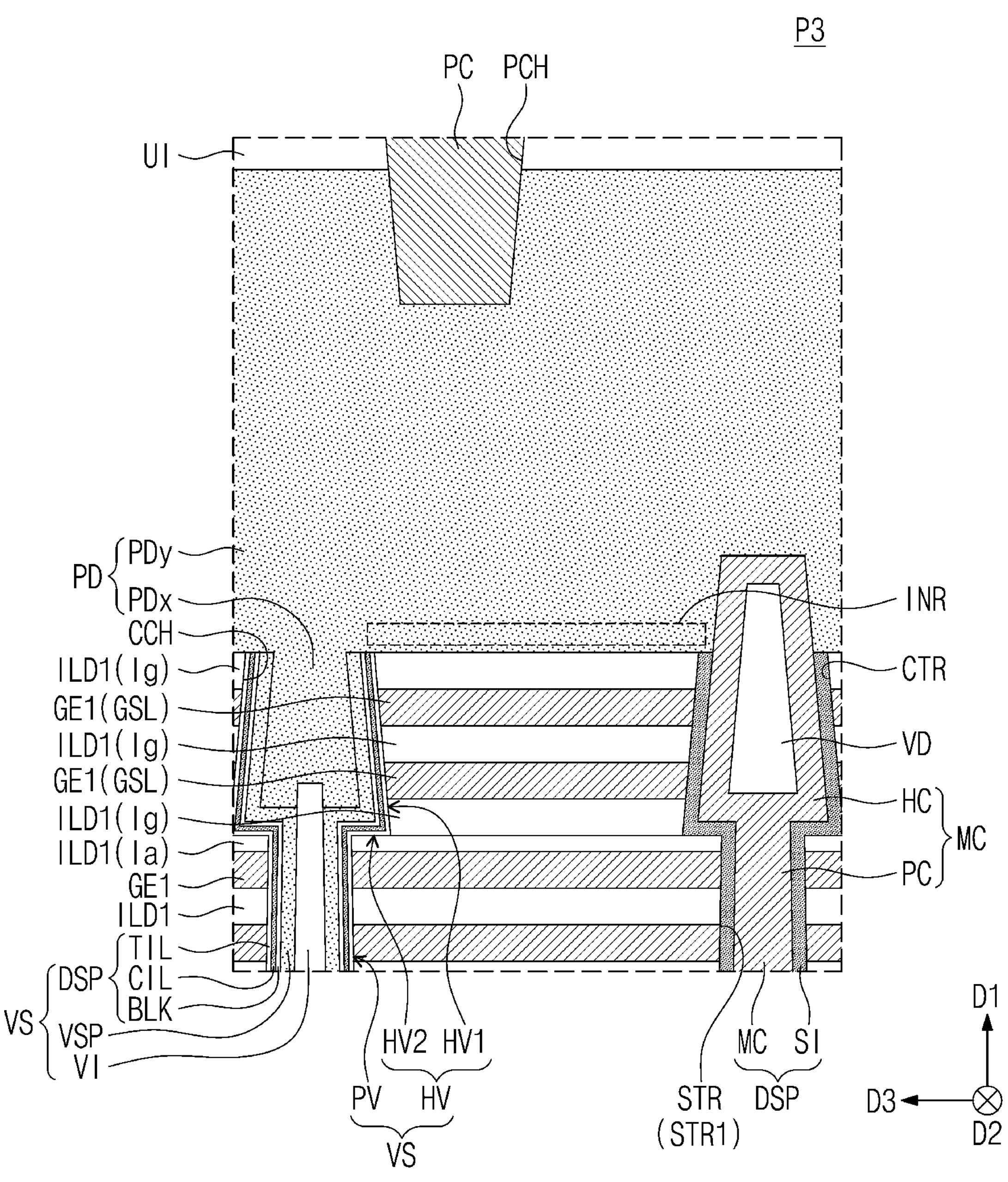
Figure 16:
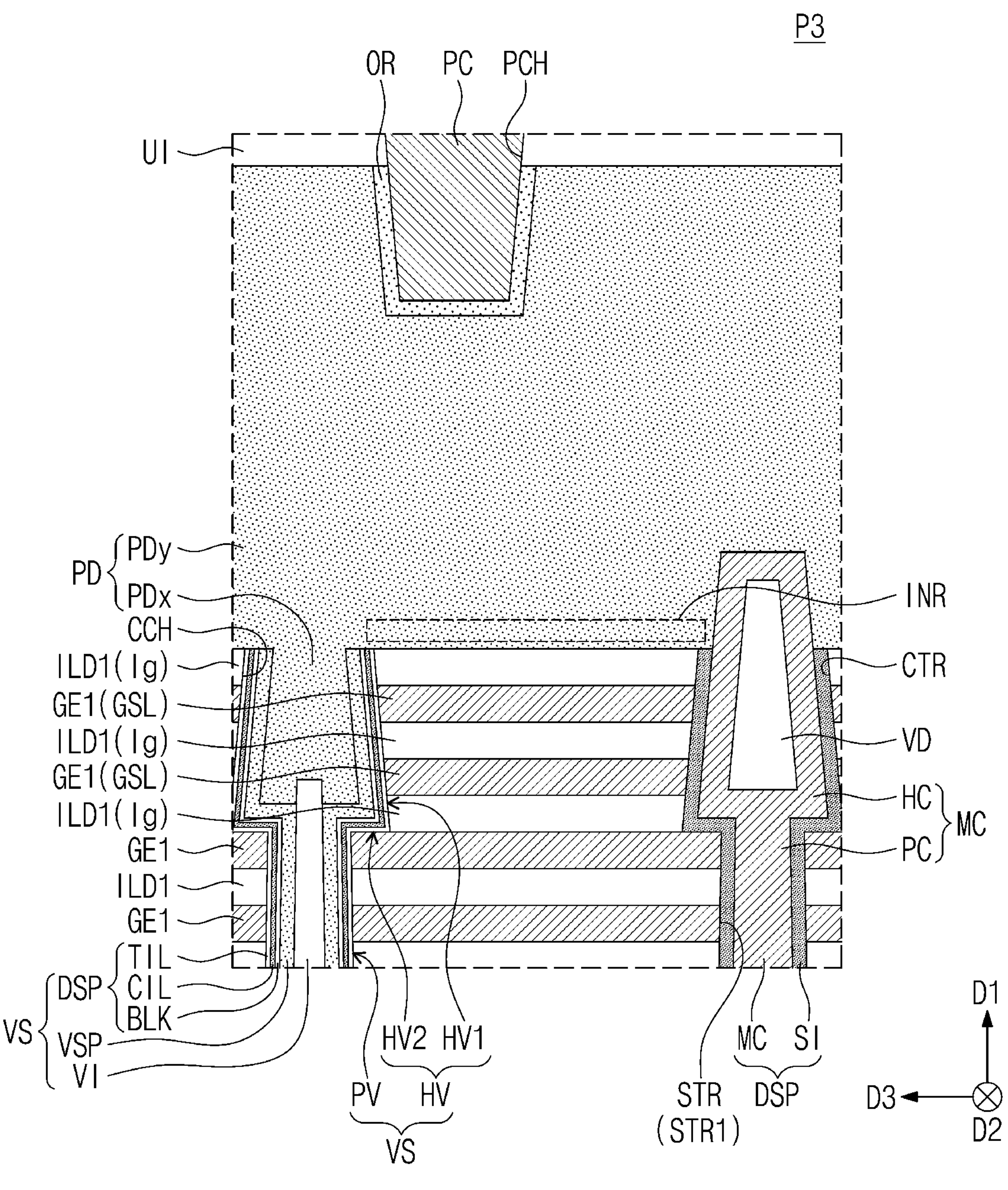

FIG. 13 illustrates an example cross-sectional view taken along lines A-A' and B-B' of FIG. 5. FIGS. 14 to 16 illustrate example enlarged cross-sectional views showing section P3 of FIG. 13.

Referring to FIGS. 13 and 14, the p-doped pattern PD covers the stack structure ST. Differently from that discussed with reference to FIG. 6, neither the n-doped pattern ND nor the undoped pattern UD is provided between the p-doped pattern PD and the stack structure ST.

The channel contact hole CCH may be provided in the stack structure ST. The channel contact hole CCH may be defined on and vertical overlap the channel hole CH. The channel contact hole CCH may penetrate the uppermost first gate electrode GE1 and the uppermost first interlayer dielectric layer ILD1. The channel contact hole CCH may penetrate two or more of the first gate electrodes GE1 and may also penetrate two or more of the first interlayer dielectric layers ILD1. For example, the two or more first gate electrodes GE1 may be called ground selection lines GSL, and the two or more first interlayer dielectric layers ILD1 may be called ground interlayer dielectric layers Ig. In this case, two or more ground selection lines GSL may be provided. One of the first gate electrodes GE1 below the channel contact hole CCH may also be the ground selection line GSL.

The channel contact hole CCH may have a width in the second direction D2 and/or the third direction D3, and the width may increase in a downward direction. When viewed in the second direction D2 and/or the third direction D3, a width at a bottom end of the channel contact hole CCH may be greater than a width at a top end of the channel hole CH. The channel contact hole CCH and the channel hole CH may be connected to each other and may have a step difference at their connection boundary.

The vertical structure VS may include a head structure HV in the channel contact hole CCH and a through structure PV in the first and second channel holes CH1 and CH2. The through structure PV may be positioned below the head structure HV. When viewed in the second direction D2 and/or the third direction D3, a width at a bottom end of the head structure HV may be greater than a width at a top end of the through structure PV.

The head structure HV may include a first head portion HV1 on an inner sidewall of the channel contact hole CCH, a first head portion HV1 on an inner bottom wall of the channel contact hole CCH, and a second head portion HV2 that connects the first head portion HV1 to the through structure PV. The first head portion HV1, the second head portion HV2, and the through structure PV may be connected to have a stepwise shape. The buried dielectric pattern VI of the second head portion HV2 may protrude in the first direction D1 more than the vertical semiconductor pattern VSP of the second head portion HV2. A bottom surface of the second head portion HV2 may be in contact with the first gate electrode GE1, but the present disclosure is not limited thereto.

The p-doped pattern PD may include a p-doped vertical pattern PDx that fills the channel contact hole CCH and a p-doped horizontal pattern PDy that covers the stack structure ST. In the channel contact hole CCH, the p-doped vertical pattern PDx may be surrounded by the head structure HV. The p-doped vertical pattern PDx may protrude into the head structure HV. The p-doped vertical pattern PDx may be in contact with and electrically connected to the vertical semiconductor pattern VSP.

A contact trench CTR may be provided on the separation trench STR. The contact trench CTR may be provided in the stack structure ST. The contact trench CTR may penetrate the uppermost first gate electrode GE1 and the uppermost first interlayer dielectric layer ILD1. For example, the contact trench CTR may penetrate the first gate electrodes GE1 and the first interlayer dielectric layers ILD1 through which the channel contact hole CCH penetrates.

A width in the third direction D3 of the contact trench CTR may increase in a downward direction. When viewed in the third direction D3, a width at a bottom end of the contact trench CTR may be greater than a width at a top end of the separation trench STR. The contact trench CTR and the separation trench STR may be connected to each other and may have a step difference at their connection boundary.

The separation dielectric pattern SI may cover inner walls of the contact trench CTR and the separation trench STR.

The separation dielectric pattern SI may have a stepwise profile at a boundary between the contact trench CTR and the separation trench STR.

The metal contact MC may include a head contact HC in the contact trench CTR and a through contact PC that fills the separation trench STR below the head contact HC. A width at a bottom end of the head contact HC may be greater than a width at a top end of the through contact PC. The head contact HC may protrude in the first direction D1 more than the separation dielectric pattern SI. The head contact HC may extend into and electrically connect with the p-doped pattern PD. A void VD may be provided in and surrounded by the metal contact MC.

The p-doped pattern PD may have an inversion region INR adjacent to the stack structure ST and between the vertical structure VS and the metal contact MC. The inversion region INR may be controlled by the ground selection line GSL. The ground selection line GSL may cause the inversion region INR to have an inversion state, and the inversion region INR may serve as a channel along which an electron moves between the metal contact MC and the vertical structure VS.

The ground selection line GSL may have a first pitch PI1 in the first direction D1. In this description, the term "pitch" may be defined as a minimum thickness or width between specific components that are repetitively and periodically provided. The ground interlayer dielectric layer Ig may have a first thickness TK1 in the first direction D1, and the ground selection line GSL may have a second thickness TK2 in the first direction D1. The first pitch PI1 may be defined as a sum of the first thickness TK1 and the second thickness TK2.

The first pitch PI1, the first thickness TK1, and the second thickness TK2 may be freely adjusted to control properties and effects of the ground selection line GSL. For example, the first thickness TK1 may be set large or the second thickness TK2 may be set small, and thus it may be possible to minimize breakdown-induced damage to a three-dimensional semiconductor memory device. For another example, the first thickness TK1 may be set small or the second thickness TK2 may be set large, and thus the ground selection line GSL may effectively control the inversion region INR.

Among the gate electrodes GE1 and GE2, a gate electrode of the memory cell transistor MCT may have a second pitch PI2 in the first direction D1. An interlayer dielectric layer other than the ground interlayer dielectric layer Ig among the interlayer dielectric layers ILD1 and ILD2 may have a third thickness TK3 in the first direction D1, and the gate electrode of the memory cell transistor MCT may have a fourth thickness TK4 in the first direction D1. The second pitch PI2 may be defined as a sum of the third thickness TK3 and the fourth thickness TK4. The first pitch PI1 and the second pitch PI2 may be the same as or different from each other. The first thickness TK1 and the third thickness TK3 may be same as or different from each other. The second thickness TK2 and the fourth thickness TK4 may be same as or different from each other.

Referring to FIG. 15, the first interlayer dielectric layer ILD1 may further include an additional dielectric layer Ia. The additional dielectric layer Ia may cover a bottom surface of the second head portion HV2, and may separate the second head portion HV2 from the first gate electrode GE1 that underlies the second head portion HV2. For example, the additional dielectric layer Ia and the first interlayer dielectric layer ILD1 that neighbor each other in the first direction D1 may be connected to each other with no boundary. The additional dielectric layer Ia may adjust a pitch of the ground selection line GSL on a region adjacent to a bottom end of the head structure HV.

Referring to FIG. 16, the p-doped pattern PD may include an ohmic region OR. The ohmic region OR may include n-type impurities. The ohmic region OR may be adjacent to the p-contact plug PC. For example, the ohmic region OR may be provided along an outer wall of the p-contact hole PCH. The p-contact plug PC and the p-doped pattern PD may constitute an ohmic junction through the ohmic region OR.

FIGS. 17 to 23 illustrate example cross-sectional views showing a method of fabricating a three-dimensional semiconductor memory device. With reference to FIGS. 17 to 23, the following will describe a method of fabricating a three-dimensional semiconductor memory device discussed with reference to FIG. 6.

Figure 17:
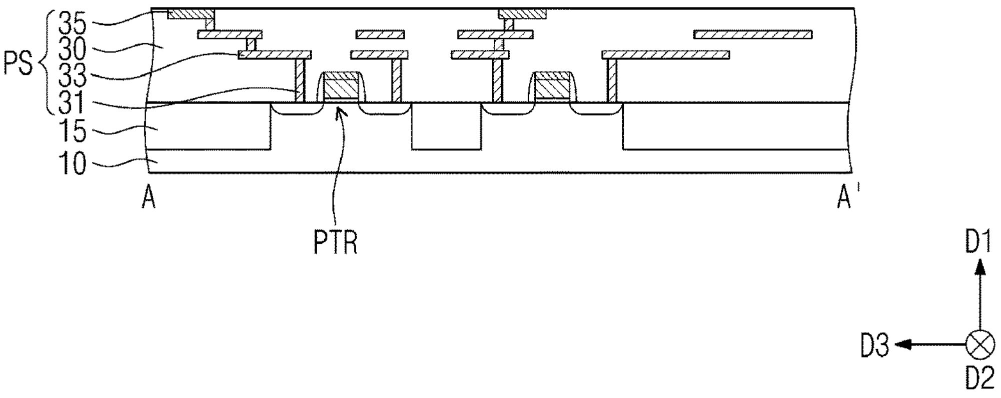
FIGS. 17 to 23 illustrate example cross-sectional views showing a method of fabricating a three-dimensional semiconductor memory device.

Referring to FIGS. 5 and 17, a peripheral circuit structure PS is formed on a peripheral substrate 10. The formation of the peripheral circuit structure PS includes forming a device isolation layer 15 in the peripheral substrate 10, forming peripheral transistors PTR on an active region of the peripheral substrate 10 defined by the device isolation layer 15, and forming peripheral contact plugs 31 electrically connected to the peripheral transistors PTR, peripheral circuit lines 33, first bonding pads 35, and a first dielectric layer 30 that covers the peripheral contact plugs 31, the peripheral circuit lines 33, and the first bonding pads 35.

The first bonding pads 35 may have their top surfaces substantially coplanar with that of the first dielectric layer 30. In this description below, the phrase "substantially coplanar with" may mean that a planarization process can be performed. The planarization process may include, for example, a chemical mechanical polishing (CMP) process or an etch-back process.

In the following explanation with reference to FIGS. 18 and 19, the term "top surface" may indicate "bottom surface" in a three-dimensional semiconductor memory device fabricated as described with reference to FIG. 6, and the term "bottom surface" may indicate "top surface" in a three-dimensional semiconductor memory device fabricated as described with reference to FIG. 6. Likewise, the languages "upper portion" and "lower portion" may mean "lower portion" and "upper portion" in a three-dimensional semiconductor memory device fabricated as described with reference to FIG. 6.

Figure 18:
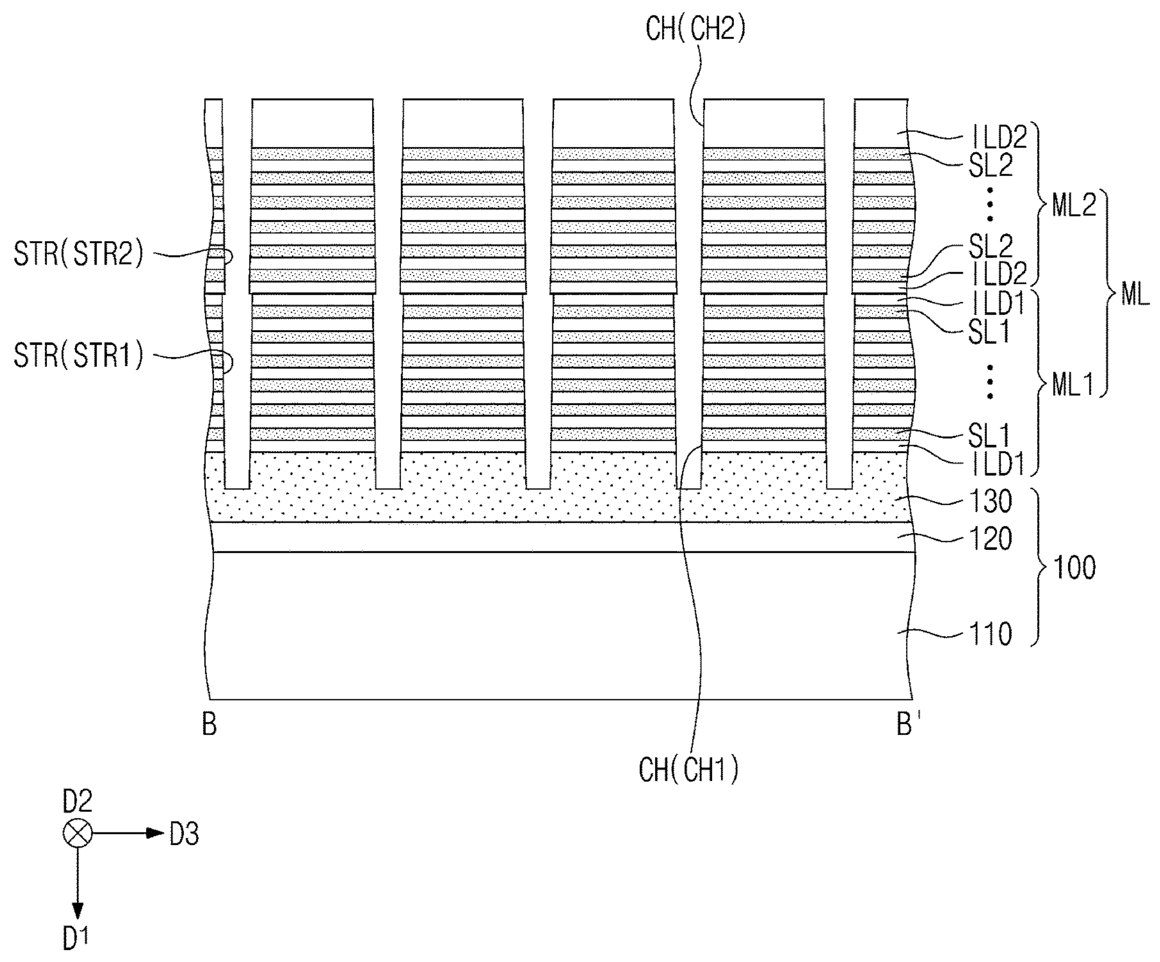

Referring to FIGS. 5 and 18, a cell array substrate 100 is provided. The cell array substrate 100 includes a first cell array substrate 110, a second cell array substrate 120, and a third cell array substrate 130 that are sequentially stacked.

The first cell array substrate 110 may be, for example, a silicon substrate, a silicon-germanium substrate, a germanium substrate, or a monocrystalline epitaxial layer grown on a monocrystalline silicon substrate. The second cell array substrate 120 may include a material having an etch selectivity with respect to the first cell array substrate 110. For example, the second cell array substrate 120 may include silicon oxide. The third cell array substrate 130 may include a semiconductor material, such as polysilicon.

A mold structure ML may be formed on the cell array substrate 100. The mold structure ML may include a first mold structure ML1 and a second mold structure ML2 on the first mold structure ML1. The formation of the mold structure ML may include sequentially forming the first mold structure ML1 and the second mold structure ML2.

For example, the first mold structure ML1 may be first formed on the cell array substrate 100. The formation of the first mold structure ML1 may include alternately stacking first interlayer dielectric layers ILD1 and first sacrificial layers SL1. In the first mold structure ML1, the first sacrificial layers SL1 may be formed of a material than can be etched with an etch selectivity with respect to the first interlayer dielectric layers ILD1. For example, the first sacrificial layers SL1 may be formed of a dielectric material different from that of the first interlayer dielectric layers ILD1. For example, the first sacrificial layers SL1 may be formed of silicon nitride, and the first interlayer dielectric layers ILD1 may be formed of silicon oxide.

Afterwards, a first channel hole CH1 and a first separation trench STR1 may be formed to penetrate in a first direction D1 through the first interlayer dielectric layers ILD1 and the first sacrificial layers SL1. The first channel hole CH1 and the first separation trench STR1 may be formed by an anisotropic etching process performed on the first mold structure ML1. The first channel hole CH1 and the first separation trench STR1 may extend into the third cell array substrate 130.

The second mold structure ML2 may be formed on the first mold structure ML1. The second mold structure ML2 may include second interlayer dielectric layers ILD2 and second sacrificial layers SL2 that are alternately stacked. The second interlayer dielectric layers ILD2 and the second sacrificial layers SL2 may have their features the same as or similar to those of the first interlayer dielectric layers ILD1 and the first sacrificial layers SL1.

Afterwards, a second channel hole CH2 and a second separation trench STR2 may be formed to penetrate in the first direction D1 through the second interlayer dielectric layers ILD2 and the second sacrificial layers SL2. The second channel hole CH2 and the second separation trench STR2 may be formed by an anisotropic etching process performed on the second mold structure ML2. The second channel hole CH2 and the second separation trench STR2 may vertically overlap the first channel hole CH1 and the first separation trench STR1, respectively. The first channel hole CH1 and the second channel hole CH2 may constitute a channel hole CH. The first separation trench STR1 and the second separation trench STR2 may constitute a separation trench STR.

Figure 19:
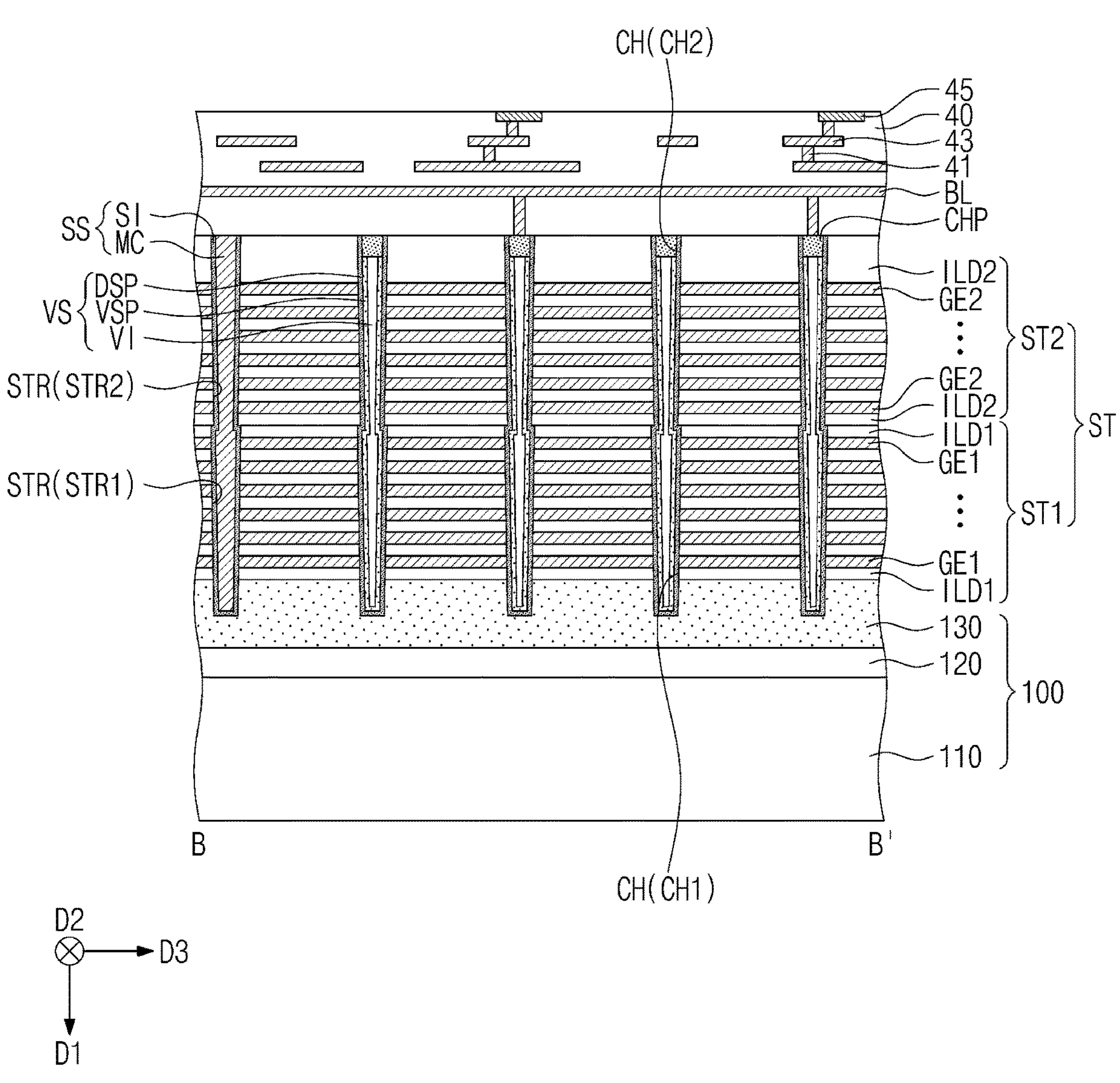

Referring to FIGS. 5 and 19, a vertical structure VS may be formed to fill the channel hole CH. The formation of the vertical channel structure VS may include sequentially forming a data storage pattern DSP, a vertical semiconductor pattern VSP, and a buried dielectric pattern VI in the channel hole CH. A channel pad CHP may be formed to fill an upper portion of the channel hole CH. The separation trench STR may be filled with a separation sacrificial pattern, lest the vertical structure VS be formed in the separation trench STR when the vertical structure VS is formed. The separation sacrificial pattern may be removed after the formation of the vertical structure VS, and the separation trench STR may be outwardly exposed again.

An isotropic etching process may be performed in which the separation trench STR is used as a path, and the first and second sacrificial layers SL1 and SL2 may be removed. First and second gate electrodes GE1 and GE2 may be formed in locations where the first and second sacrificial layers SL1 and SL2 are removed, and thus a stack structure ST may be formed.

A separation pattern SS may be formed to fill the separation trench STR. The formation of the separation pattern SS may include sequentially forming a separation dielectric pattern SI and a metal contact MC in the separation trench STR. Thereafter, a second dielectric layer 40, cell contact plugs 41, cell circuit lines 43, and second bonding pads 45 may be formed on the stack structure ST. The cell contact plugs 41, the cell circuit lines 43, and the second bonding pads 45 may be electrically connected to each other, and the second dielectric layer 40 may be formed to surround the cell contact plugs 41, the cell circuit lines 43, and the second bonding pads 45.

Figure 20:
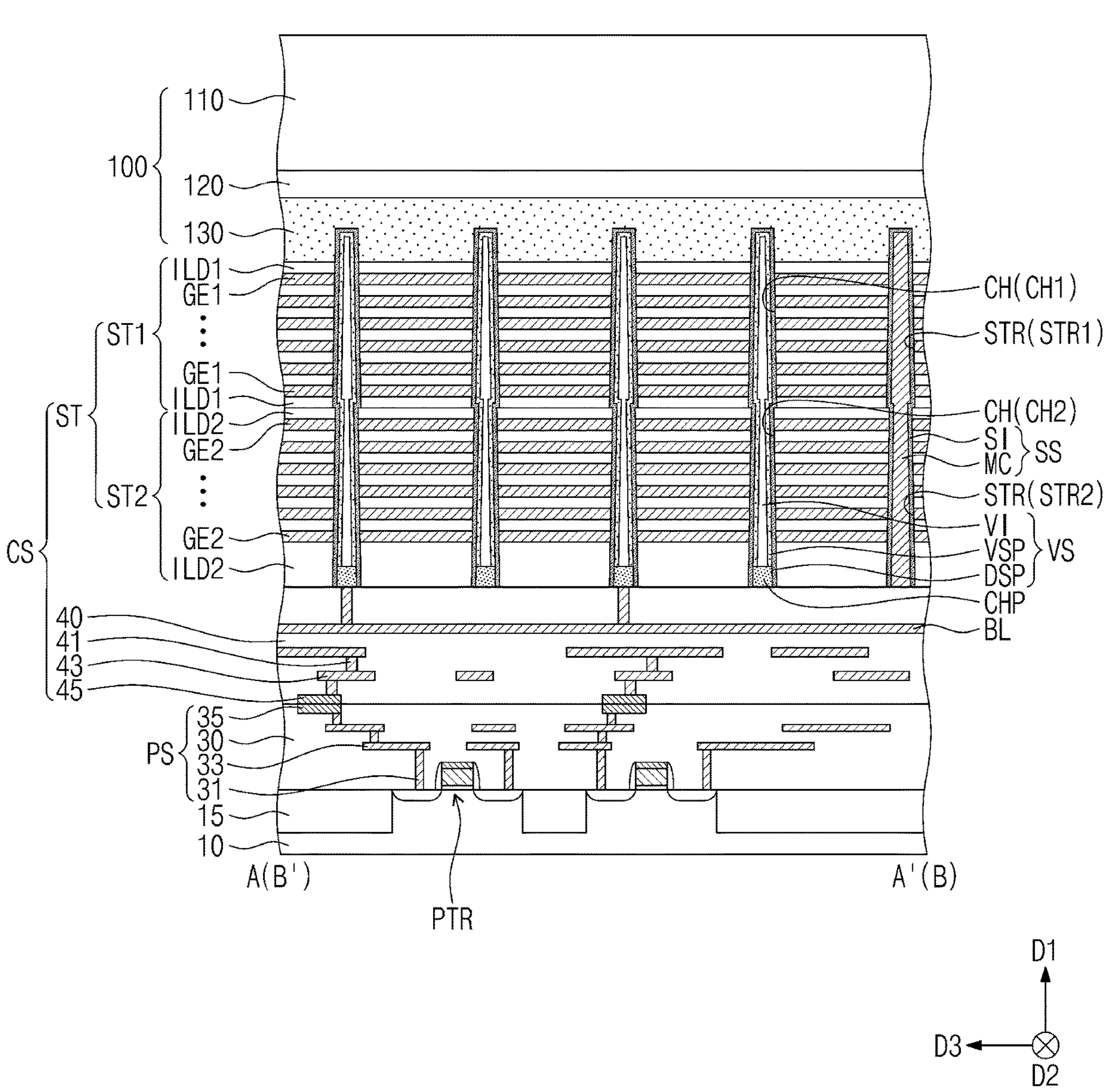

Referring to FIGS. 5 and 20, the peripheral circuit structure PS and a cell array structure CS may be bonded to each other. For example, the first bonding pads 35 of the peripheral circuit structure PS may be bonded to and in contact with the second bonding pads 45 of the cell array structure CS. Therefore, the first dielectric layer 30 and the second dielectric layer 40 may also be bonded to each other.

As the first and second bonding pads 35 and 45 are bonded to each other, the cell array structure CS may be turned upside down. Therefore, in explaining a fabrication method after the bonding, the languages "top surface", "bottom surface", "upper portion", and "lower portion" may mean the languages "top surface", "bottom surface", "upper portion", and "lower portion" discussed with reference to FIG. 6.

Figure 21:
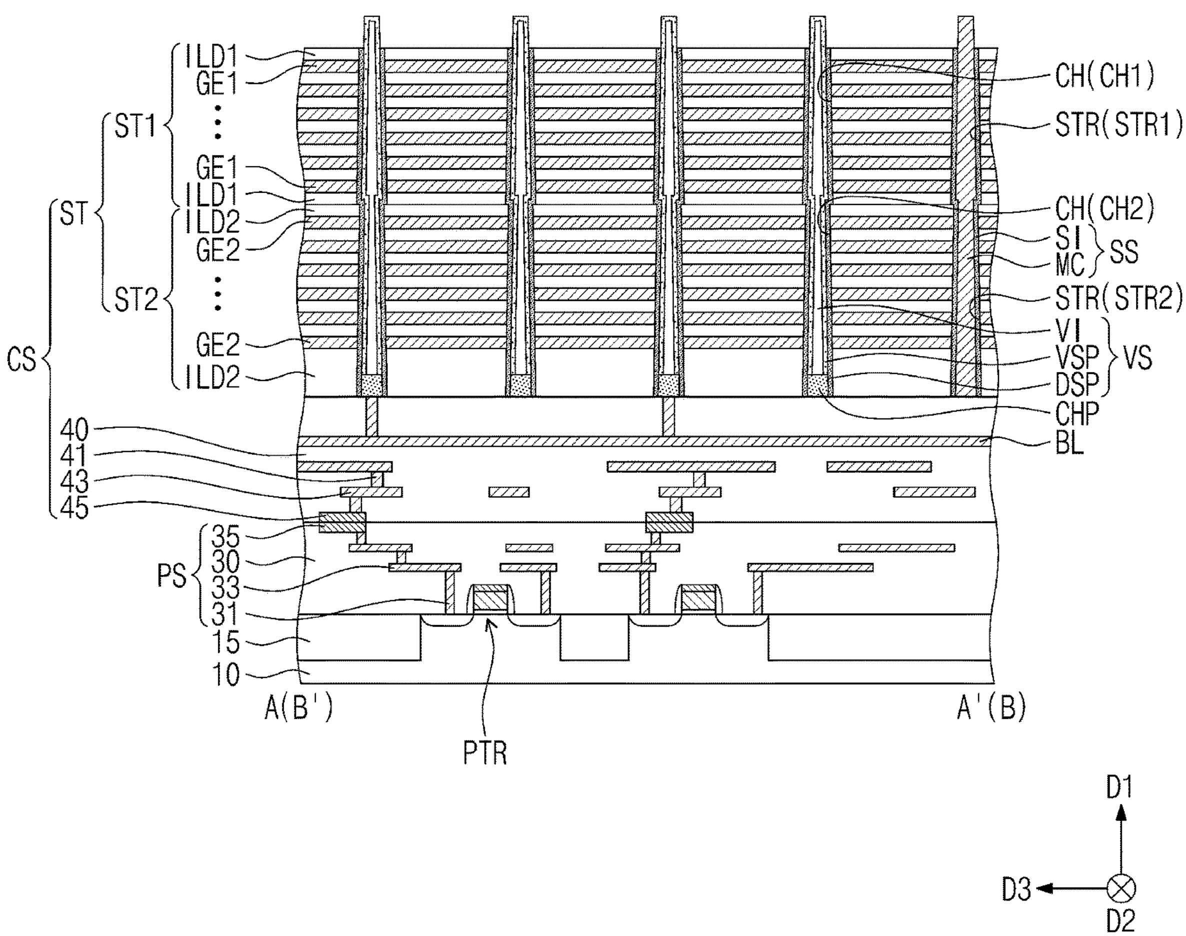

Referring to FIGS. 5 and 21, the cell array substrate 100 may be provided. The removal of the cell array substrate 100 may be achieved by at least one selected from a grinding process, a planarization process, a dry etching process, and/a wet etching process. For example, the removal of the cell array substrate 100 may include sequentially removing the first, second, and third cell array substrates 110, 120, and 130.

The removal of the cell array substrate 100 may outwardly expose the data storage pattern DSP of the vertical structure VS, the separation dielectric pattern SI of the separation pattern SS, and an uppermost first interlayer dielectric layer ILD1. An exposed portion of the data storage pattern DSP may be removed, and an exposed portion of the separation dielectric pattern SI may be removed. Therefore, the vertical semiconductor pattern VSP may be exposed above the channel hole CH, and the metal contact MC may be exposed above the separation trench STR. A p-type impurity may further be doped into the exposed portion of the vertical semiconductor pattern VSP, but the present disclosure is not limited thereto.

Figure 22:
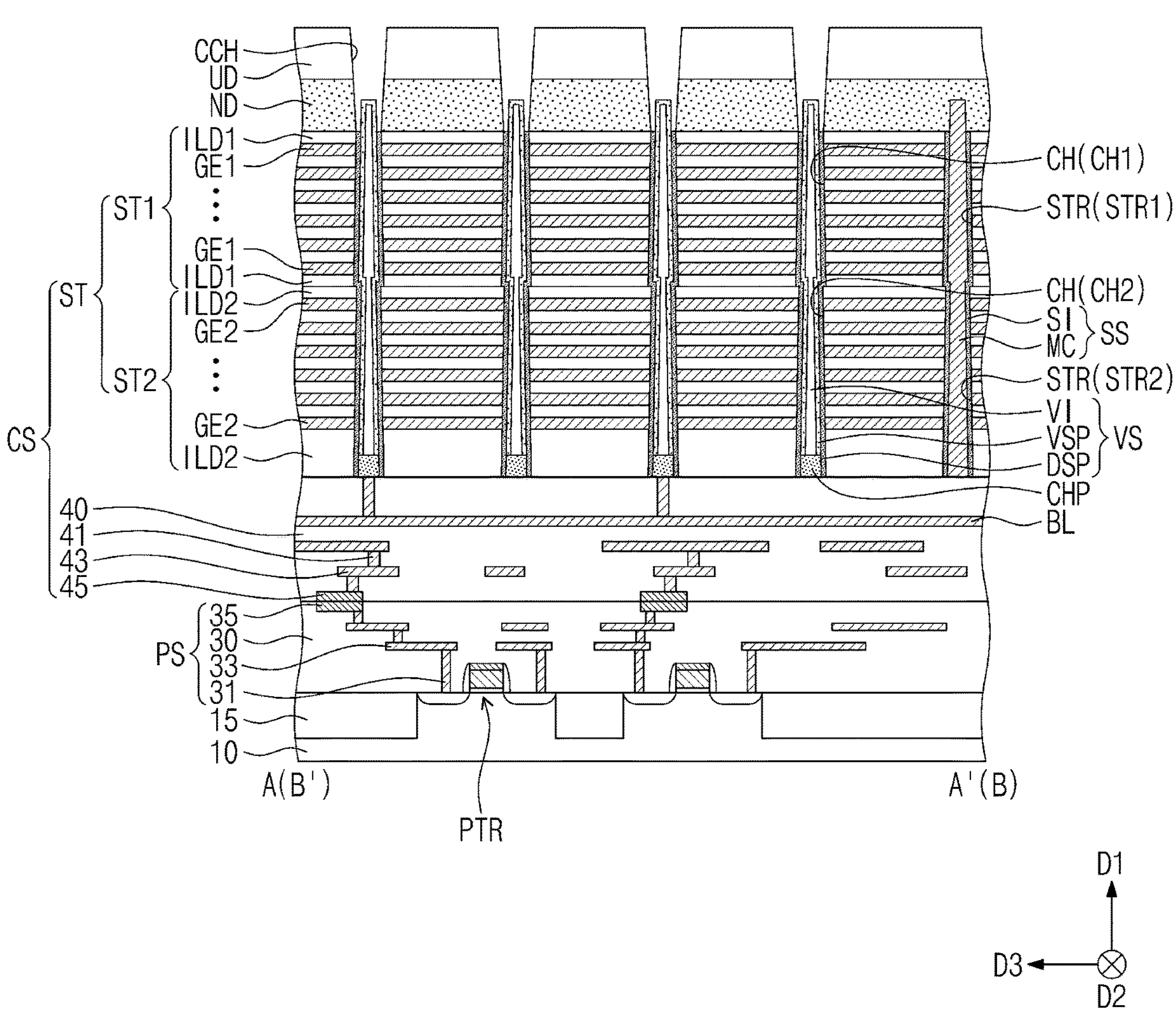

Referring to FIGS. 5 and 22, an n-doped pattern ND may be formed on the stack structure ST. The n-doped pattern ND may be formed to cover the exposed portion of the vertical semiconductor pattern VSP and the exposed portion of the metal contact MC. For example, the n-doped pattern ND may be formed to cover a top surface of the vertical semiconductor pattern VSP and a top surface of the metal contact MC. As discussed with reference to FIG. 8, the n-doped pattern ND may be formed to have a doping concentration that is changed in accordance with regions. For example, the formation of the n-doped pattern ND may include sequentially forming a first n-doped region ND1, a second n-doped region ND2, and a third n-doped region ND3.

An undoped pattern UD may be formed to cover the n-doped pattern ND. A channel contact hole CCH may be formed to penetrate the undoped pattern UD and the n-doped pattern ND. The channel contact hole CCH may be formed to vertically overlap the channel hole CH. In the channel contact hole CCH, a portion of the vertical semiconductor pattern VSP may be outwardly exposed again.

Figure 23:
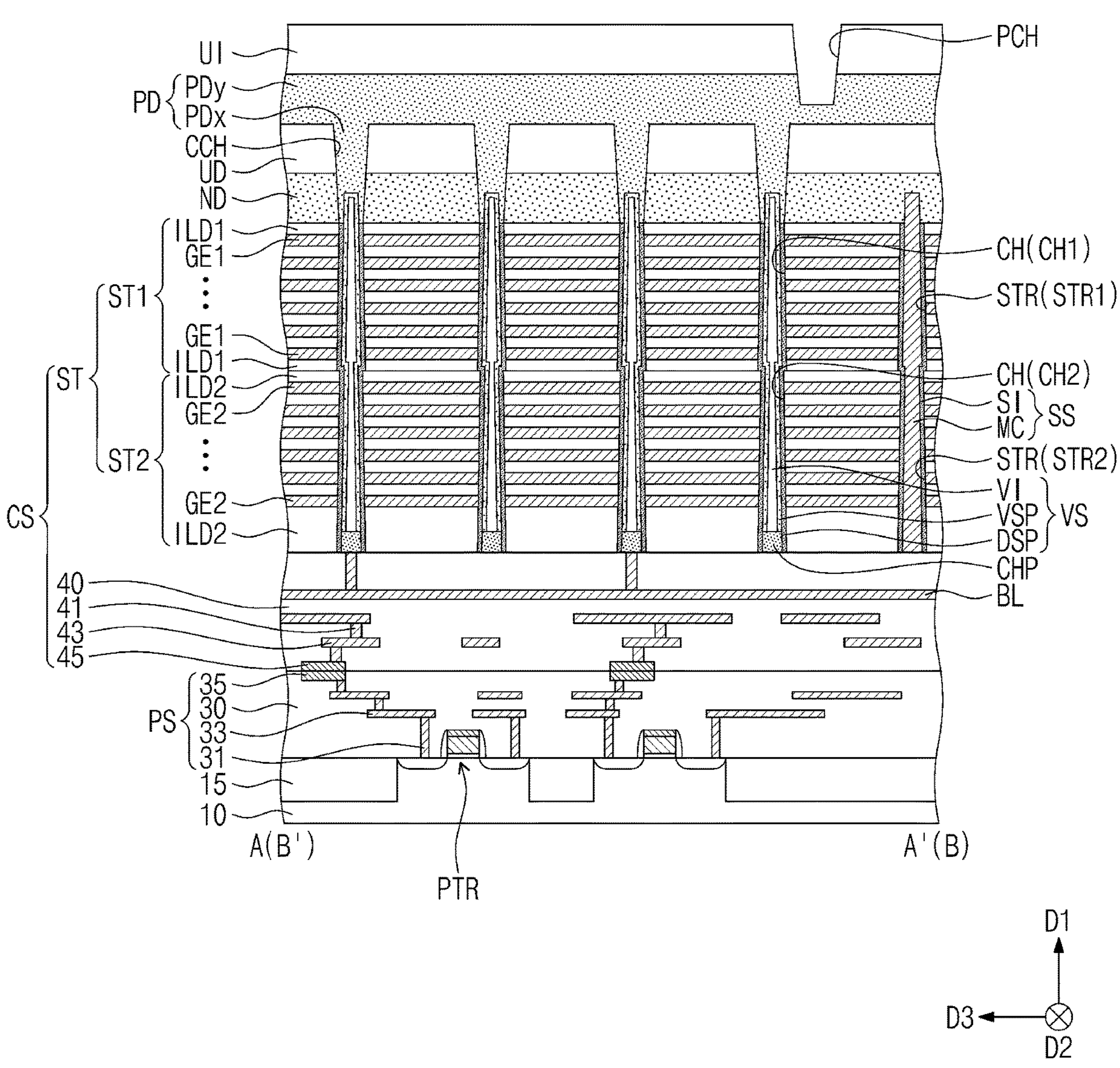

Referring to FIGS. 5 and 23, a p-doped pattern PD may be formed on the undoped pattern UD. The p-doped pattern PD may fill the channel contact hole CCH and may cover a top surface of the undoped pattern UD. In the channel contact hole CCH, the p-doped pattern PD may be in contact with and electrically connected to the vertical semiconductor pattern VSP. As discussed with reference to FIG. 8, the p-doped pattern PD may be formed to have a doping concentration that is changed in accordance with regions. The formation of the p-doped pattern PD may include sequentially forming a first p-doped region PD1 and a second p-doped region PD2 of FIG. 8. For example, the first p-doped region PD1 may be formed to conformally cover an inner lateral surface of the channel contact hole CCH and the top surface of the undoped pattern UD, and the second p-doped region PD2 may be formed to fill the channel contact hole CCH and to cover the first p-doped region PD1.

After the formation of the p-doped pattern PD, a laser annealing process may further be performed. The laser annealing process may crystallize semiconductor materials in the n-doped pattern ND and the p-doped pattern PD, and may activate impurities.

An upper dielectric layer UI may be formed on the p-doped pattern PD. A p-contact hole PCH may be formed to penetrate the upper dielectric layer UI and to extend into the p-doped pattern PD. The p-contact hole PCH may outwardly expose the p-doped pattern PD in a lower portion thereof.

After the formation of the p-contact hole PCH, an ohmic region OR of FIG. 10 may further be formed on an exposed portion of the p-doped pattern PD I the p-contact hole PCH. The formation of the ohmic region OR may include doping n-type impurities into the exposed portion of the p-doped pattern PD.

Referring back to FIGS. 5 and 6, a p-contact plug PC and an upper circuit line UL may be formed. The p-contact plug PC may be formed to fill the p-contact hole PCH, and the upper circuit line UL may be formed on the upper dielectric layer UI. The p-contact plug PC and the upper circuit line UL may be formed through a damascene process, but the present disclosure is not limited thereto.

FIGS. 24 to 30 illustrate other example cross-sectional views showing a method of fabricating a three-dimensional semiconductor memory device. With reference to FIGS. 24 to 30, the following will describe a method of fabricating a three-dimensional semiconductor memory device discussed with reference to FIG. 13.

Figure 24:
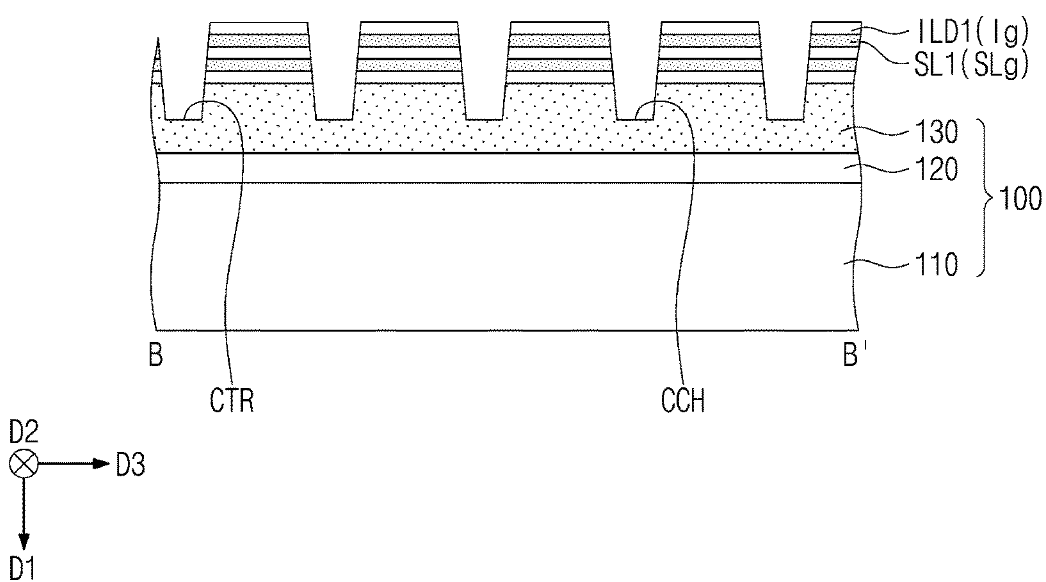
FIGS. 24 to 30 illustrate other example cross-sectional views showing a method of fabricating a three-dimensional semiconductor memory device.

Referring to FIGS. 5 and 24, some of the first interlayer dielectric layers ILD1 and some of the first sacrificial layers SL1 are alternately stacked on the cell array substrate 100. The some of the first interlayer dielectric layers ILD1 are ground interlayer dielectric layers Ig, and the some of the first sacrificial layers SL1 are ground sacrificial layers SLg.

A channel contact hole CCH and a contact trench CTR may be formed to penetrate the ground interlayer dielectric layers Ig and the ground sacrificial layers SLg. The channel contact hole CCH and the contact trench CTR may extend until into the cell array substrate 100 (e.g., into the third cell array substrate 130).

Figure 25:
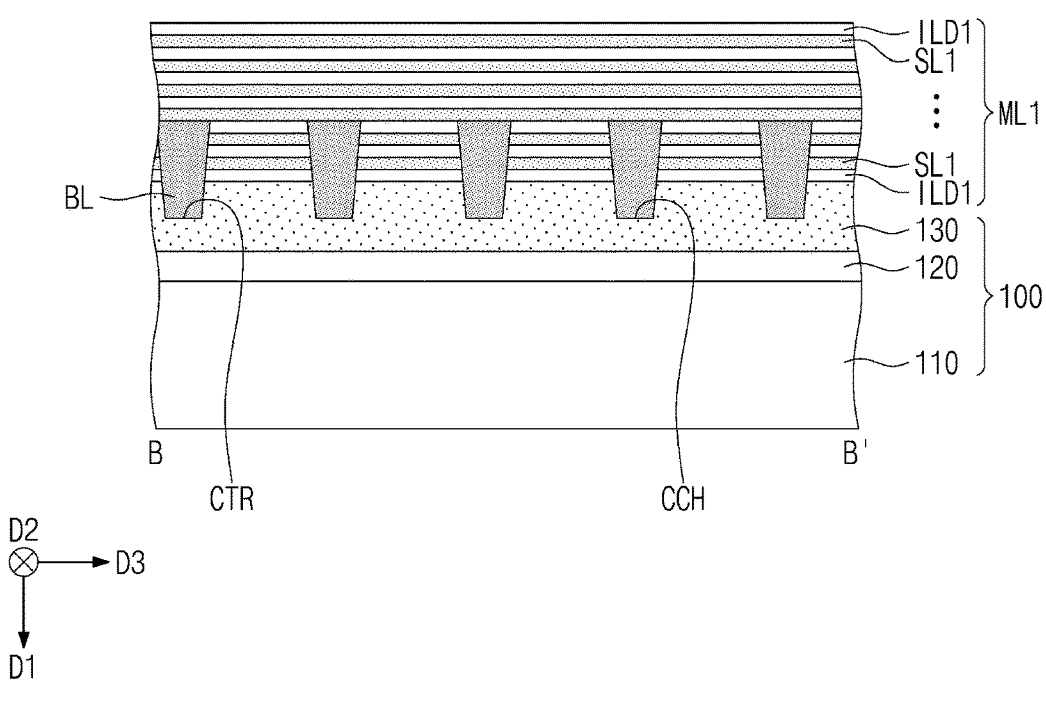

Referring to FIGS. 5 and 25, a buried sacrificial pattern BS may be formed to fill the channel contact hole CCH and the contact trench CTR. The formation of the buried sacrificial pattern BS may include depositing the buried sacrificial pattern BS to fill the channel contact hole CCH and the contact trench CTR and to cover the ground interlayer dielectric layer Ig, and removing the buried sacrificial pattern BS that covers the ground interlayer dielectric layer Ig. The removal of the buried sacrificial pattern BS may include performing a planarization process. In the removal process, the buried sacrificial pattern BS may expose a top surface of the ground interlayer dielectric layer Ig and may remain in the channel contact hole CCH and the contact trench CTR. For example, the buried sacrificial pattern BS may include metal or metal nitride.

Although not shown, after the formation of the buried sacrificial pattern BS, an additional dielectric layer Ia discussed with reference to FIG. 15 may further be formed on the buried sacrificial pattern BS and the ground interlayer dielectric layer Ig. After that, the additional dielectric layer Ia may be left or removed based on effects of subsequent processes or adjustment of pitch. Afterwards, the first interlayer dielectric layers ILD1 and the first sacrificial layers SL1 may further be formed on the buried sacrificial pattern BS and the ground interlayer dielectric layer Ig, with the result that a first mold structure ML1 may be formed.

Figure 26:
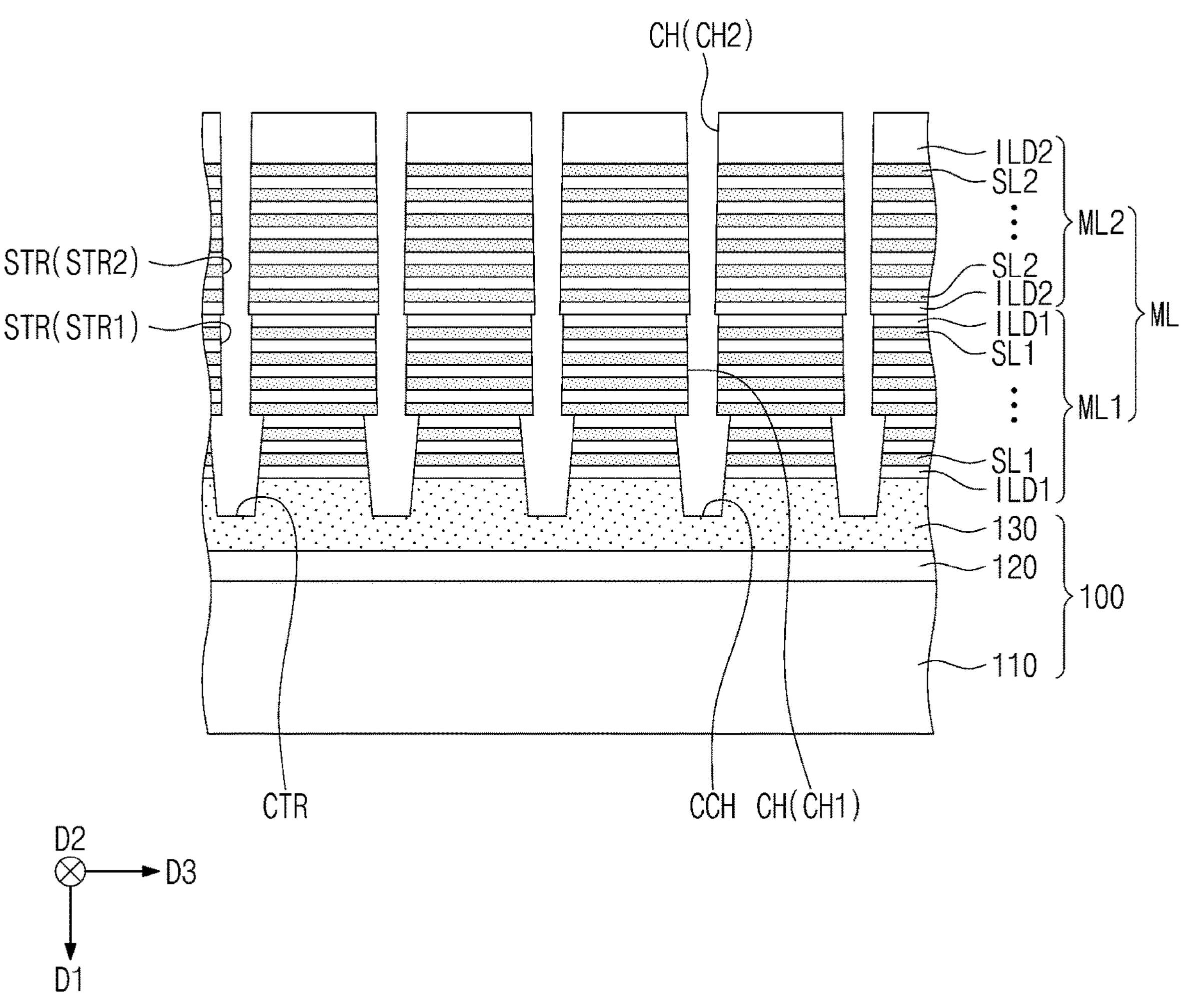

Referring to FIGS. 5 and 26, a first channel hole CH1 and a first separation trench STR1 may be formed to penetrate the first interlayer dielectric layers ILD1 and the first sacrificial layers SL1. The first channel hole CH1 and the first separation trench STR1 may extend until into the buried sacrificial pattern BS, and may outwardly expose an inside of the buried sacrificial pattern BS.

A second mold structure ML2 may be formed on the first mold structure ML1, and thus a mold structure ML may be formed on the cell array substrate 100. Afterwards, a second channel hole CH2 and a second separation trench STR2 may be formed to penetrate in the first direction D1 through the second interlayer dielectric layers ILD2 and the second sacrificial layers SL2. The second channel hole CH2 and the second separation trench STR2 may vertically overlap the first channel hole CH1 and the first separation trench STR1, respectively.

The buried sacrificial pattern BS may be removed which is exposed through the first channel hole CH1. Thus, the channel contact hole CCH and the contact trench CTR may become empty. The ground interlayer dielectric layer Ig and the ground sacrificial layer SLg may be outwardly exposed on inner lateral surfaces of the channel contact hole CCH and the contact trench CTR.

Figure 27:
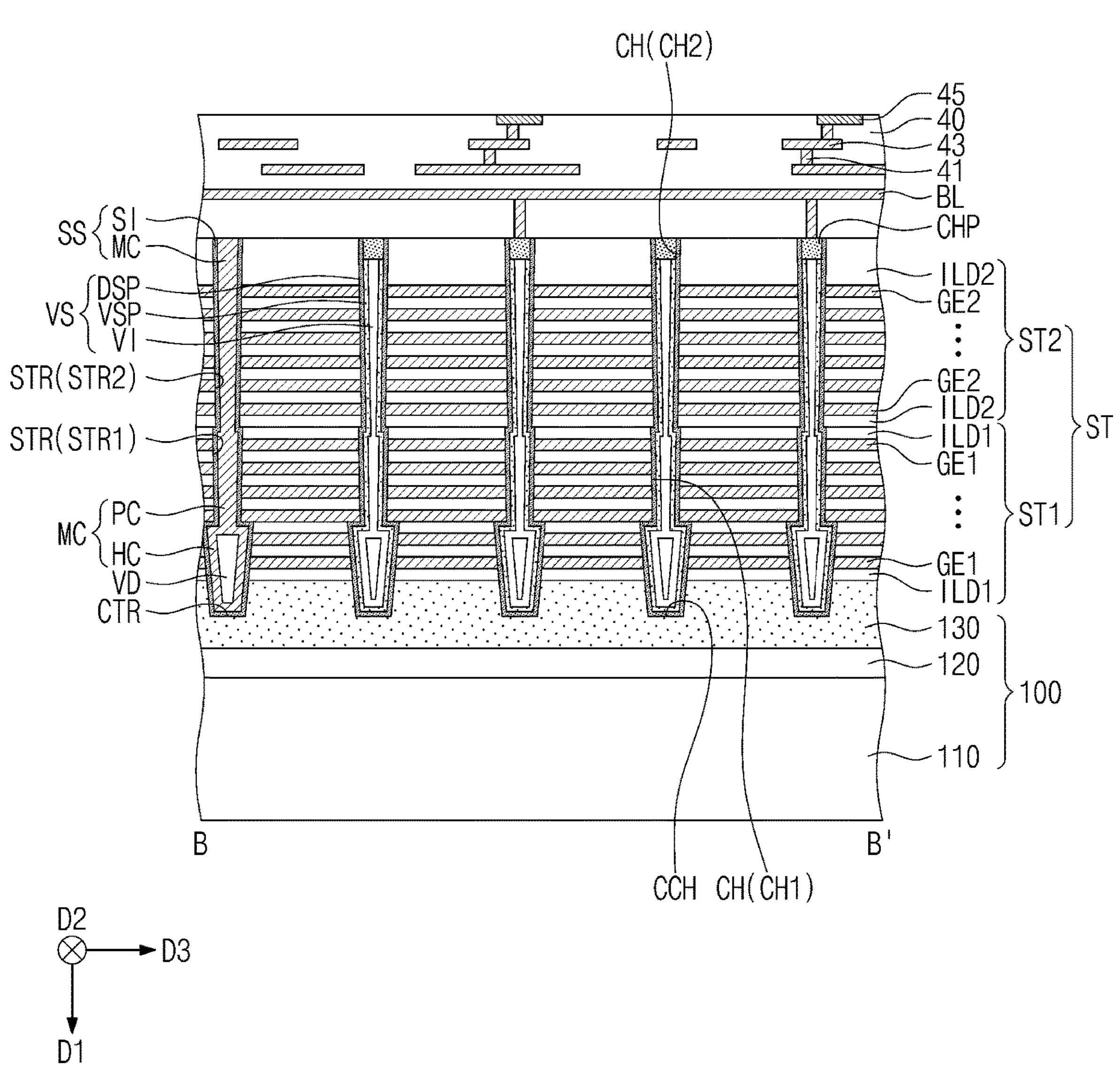

Referring to FIGS. 5 and 27, a vertical structure VS may be formed to fill the channel hole CH and the channel contact hole CCH. In this procedure, a step difference between the channel contact hole CCH and the channel hole CH may form a void VD in the vertical structure VS. A channel pad CHP may be formed to fill an upper portion of the channel hole CH. The vertical structure VS may include a head structure HV in the channel contact hole CCH and a through structure PV in the first and second channel holes CH1 and CH2.

The separation trench STR and the contact trench CTR may be filled with a separation sacrificial pattern, lest the vertical structure VS be formed in the separation trench STR and the contact trench CTR when the vertical structure VS is formed. The separation sacrificial pattern may be removed after the formation of the vertical structure VS, and the separation trench STR and the contact trench CTR may be outwardly exposed again.

Through a process similar to that discussed with reference to FIG. 19, the first and second sacrificial layers SL1 and SL2 may be replaced with first and second gate electrodes GE1 and GE2, and thus a stack structure ST may be formed. A separation dielectric pattern SI and a metal contact MC of a separation pattern SS may be formed to fill the separation trench STR. In this procedure, a step difference between the contact trench CTR and the separation trench STR may form a void VD in the metal contact MC. The metal contact MC may include a head contact HC in the contact trench CTR and a through contact PC that fills the separation trench STR below the head contact HC. Thereafter, a second dielectric layer 40, cell contact plugs 41, cell circuit lines 43, and second bonding pads 45 may be formed on the stack structure ST.

Figure 28:
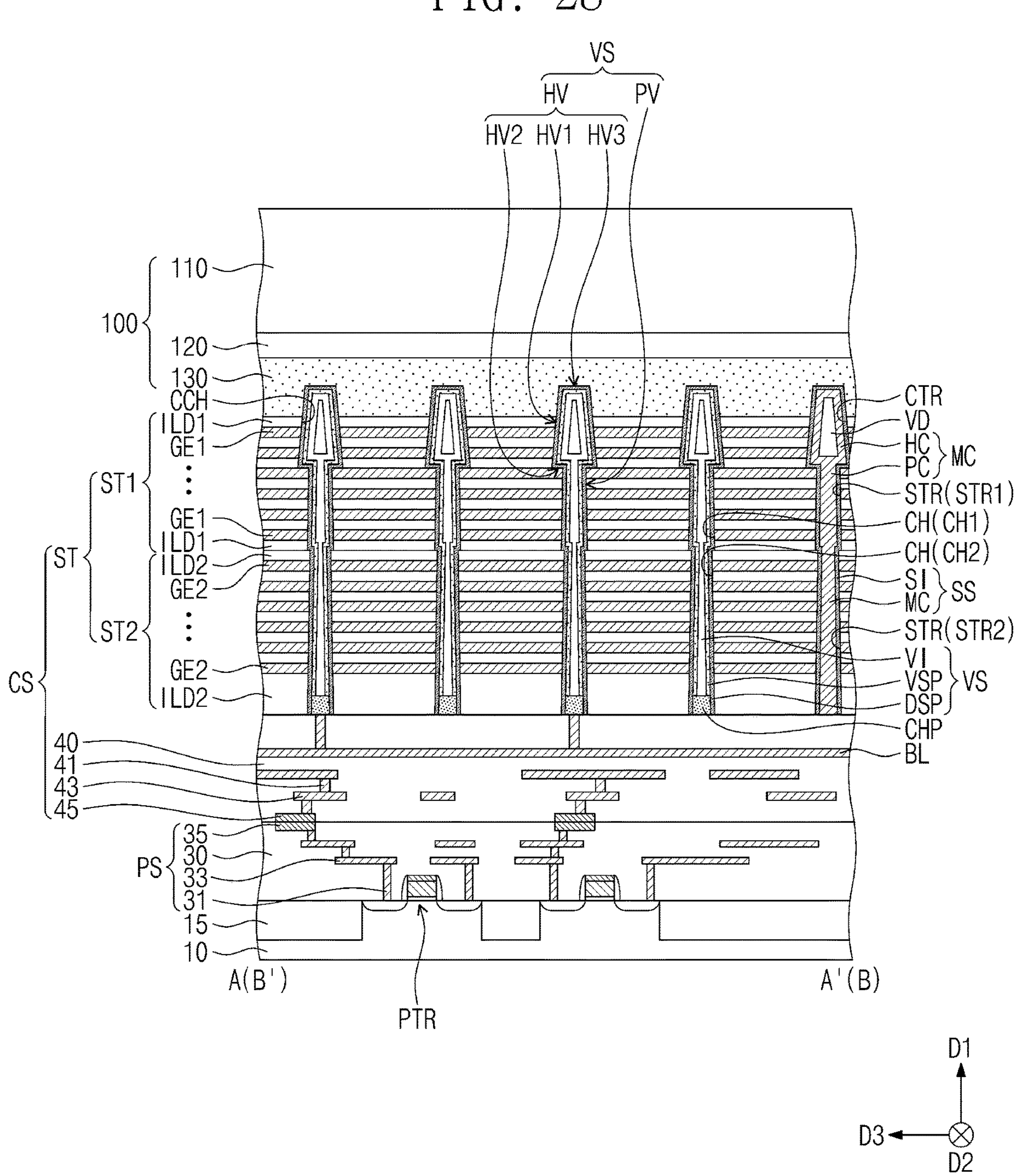

Referring to FIGS. 5 and 28, the peripheral circuit structure PS and a cell array structure CS may be bonded to each other. Thus, the head structure HV may be positioned on an upper portion of the vertical structure VS. After the bonding, the head structure HV may include a third head portion HV3 that covers the first head portion HV1.

Figure 29:
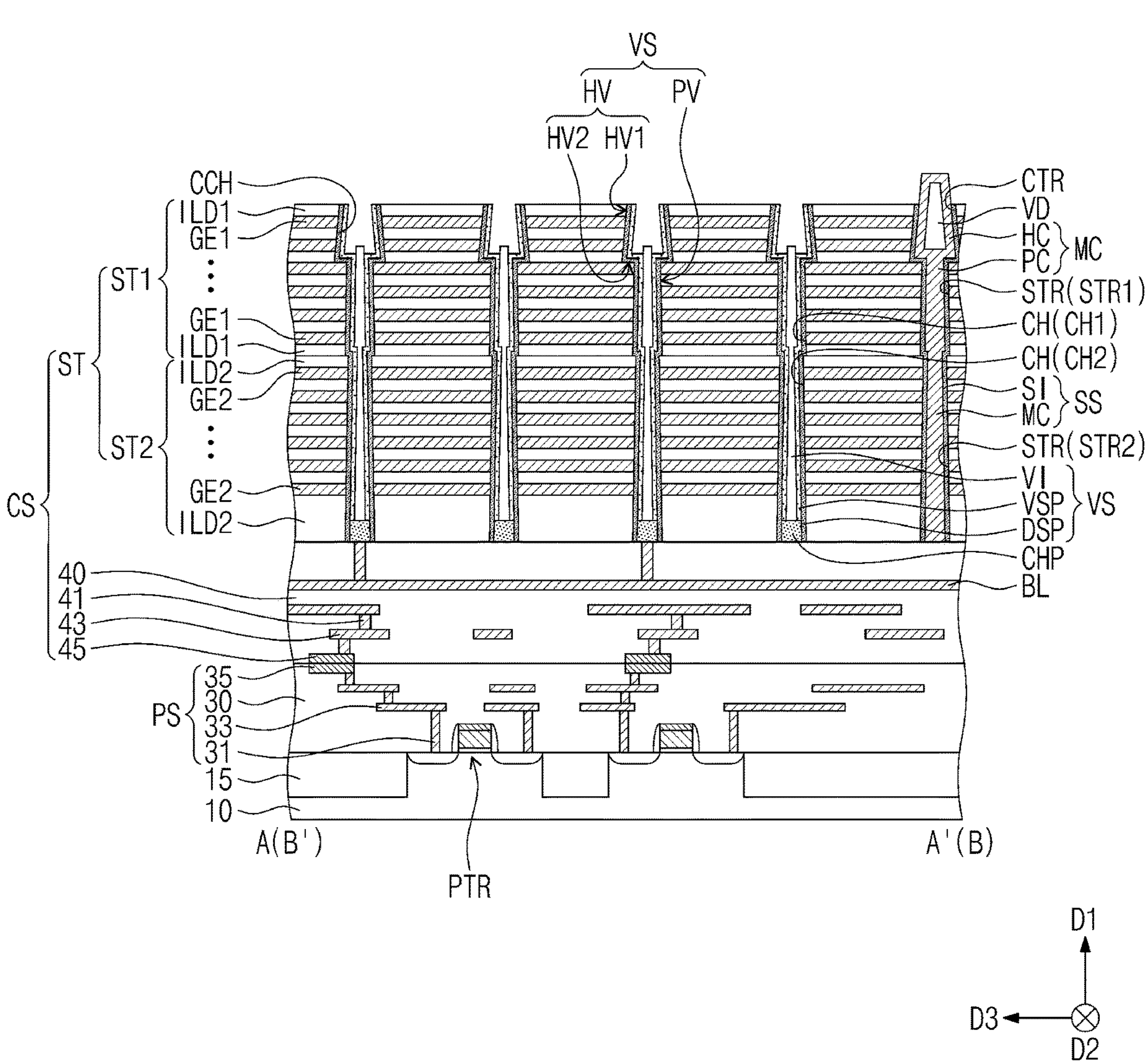

Referring to FIGS. 5 and 29, the cell array substrate 100 may be removed. The removal of the cell array substrate 100 may outwardly expose an upper portion of the head structure HV and an upper portion of the separation pattern SS. The exposed upper portion of the head structure HV may be removed. For example, the third head portion HV3 and an upper portion of the first head portion HV1 positioned above the stack structure ST may be removed, and the void VD in the head structure HV may be exposed. In this procedure, a portion of the buried dielectric pattern VI in the channel contact hole CCH may further be removed. Therefore, in the channel contact hole CH, the vertical semiconductor pattern VSP of the first head portion HV1 may be exposed.

The exposed upper portion of the separation pattern SS may be removed. For example, the separation dielectric pattern SI may be removed from the exposed upper portion of the separation pattern SS, and the head contact HC may be left and outwardly exposed without being removed. An upper portion of the head contact HC may upwardly protrude from the stack structure ST. The head contact HC may separate the void VD therein from the outside.

Figure 30:
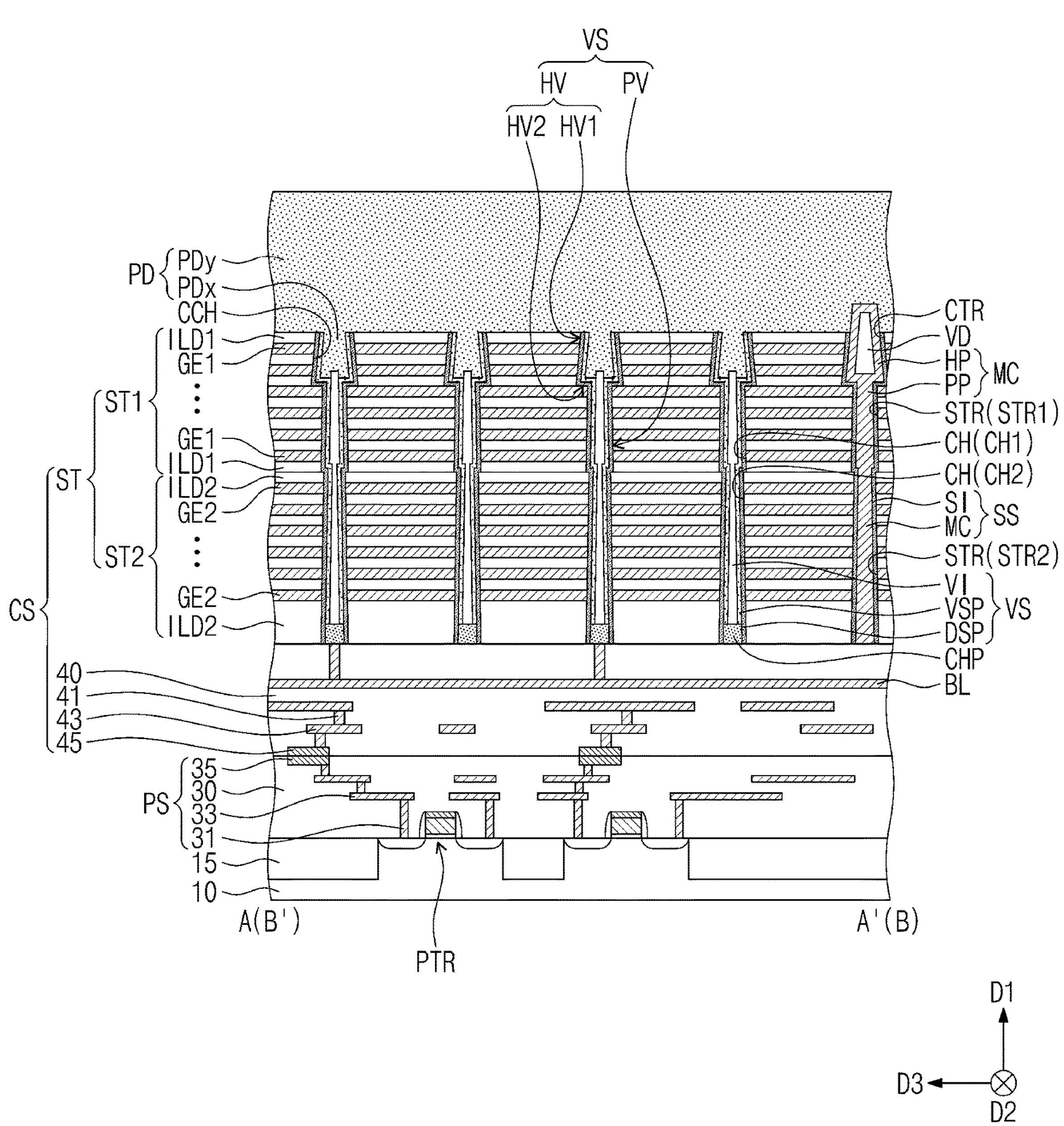

Referring to FIGS. 5 and 30, a p-doped pattern PD may be formed on the stack structure ST. The p-doped pattern PD may fill the channel contact hole CCH, and may cover a top surface of the stack structure ST and an upper portion of the head contact HC. In the channel contact hole CCH, the p-doped pattern PD may be in contact with and electrically connected to the vertical semiconductor pattern VSP. The p-doped pattern PD may be in contact with and electrically connected to the upper portion of the head contact HC.

Referring back to FIGS. 5 and 13, an upper dielectric layer UI may be formed on the p-doped pattern PD. A p-contact hole PCH may be formed to penetrate the upper dielectric layer UI and to extend into the p-doped pattern PD. A p-contact plug PC may be formed to fill the p-contact hole PCH, and an upper circuit line UL may be formed on the upper dielectric layer UI.

According to the present disclosure, a p-doped pattern may be utilized to perform a data erase operation of a three-dimensional semiconductor memory device, and the erase operation may be simultaneously executed on a plurality of memory cell transistors. As a result, the three-dimensional semiconductor memory device and an electronic system including the same may increase in speed of erase operation.

In addition, an undoped pattern may be positioned between a p-doped pattern and an n-doped pattern, and thus a junction leakage may be minimized between the p-doped pattern and the n-doped pattern. Accordingly, the three-dimensional semiconductor memory device and an electronic system including the same may have improved electrical properties and increased reliability.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

The aforementioned description provides some implementations for explaining the present disclosure. However, the present disclosure is not limited to the implementations described above, and it will be understood by one of ordinary skill in the art that variations in form and detail may be made therein without departing from the spirit and essential features of the present disclosure.

What is claimed is:

1. A three-dimensional semiconductor memory device comprising:

a circuit structure on a substrate;

a stack structure that includes a plurality of gate electrodes stacked on the circuit structure;

an n-doped pattern on the stack structure;

a vertical structure that extends through the stack structure into the n-doped pattern;

a p-doped pattern on the n-doped pattern; and an undoped pattern between the n-doped pattern and then p-doped pattern, wherein the p-doped pattern includes:

a p-doped horizontal pattern on the undoped pattern; and a p-doped vertical pattern that extends through the undoped pattern and the n-doped pattern and that contacts with the vertical structure.

2. The device of claim 1, wherein the undoped pattern vertically separates the p-doped horizontal pattern from the n-doped pattern.

3. The device of claim 1, wherein the undoped pattern covers a top surface of the n-doped pattern.

4. The device of claim 1, wherein the stack structure includes a plurality of structures that are horizontally spaced apart from each other, and the device comprises a separation structure that separates the plurality of structures from each other and that extends into the n-doped pattern.

5. The device of claim 4, wherein the separation structure includes:

a metal contact electrically connected to the n-doped pattern; and a separation dielectric pattern between the metal contact and the stack structure.

6. The device of claim 1, comprising a metal contact that extends through the p-doped pattern and the undoped pattern into the n-doped pattern.

7. The device of claim 1, wherein a doping concentration of the n-doped pattern increases continuously or discontinuously in a downward direction.

8. The device of claim 1, wherein a doping concentration of the p-doped horizontal pattern decreases continuously or discontinuously in a downward direction.

9. The device of claim 1, wherein an upper portion of the p-doped vertical pattern is surrounded by the undoped pattern, and a lower portion of the p-doped vertical pattern is surrounded by the n-doped pattern.

10. The device of claim 9, wherein, in a plan view, a doping concentration at the upper portion of the p-doped vertical pattern decreases continuously or discontinuously with decreasing distance from the undoped pattern.

11. The device of claim 9, wherein, in a plan view, a doping concentration at the lower portion of the p-doped vertical pattern decreases continuously or discontinuously with decreasing distance from the n-doped pattern.

12. The device of claim 1, comprising a p-contact plug electrically connected to the p-doped pattern, wherein the p-doped pattern includes an ohmic region adjacent to the p-contact plug, and wherein the ohmic region includes an n-type impurity.

13. The device of claim 1, wherein a width in a horizontal direction of the p-doped vertical pattern decreases in a downward direction.

14. A three-dimensional semiconductor memory device comprising:

a circuit structure on a substrate;

a stack structure that includes a plurality of gate electrodes stacked on the circuit structure;

an n-doped pattern on the stack structure;

a vertical structure that extends through the stack structure into the n-doped pattern;

an undoped pattern on the n-doped pattern;

a p-doped pattern that extends through the undoped pattern and the n-doped pattern and that contacts with the vertical structure;

a metal contact electrically connected to the n-doped pattern; and a p-contact plug electrically connected to the p-doped pattern.

15. The device of claim 14, wherein the p-doped pattern covers a top surface of the undoped pattern.

16. The device of claim 14, wherein the n-doped pattern includes:

a first n-doped region; and a second n-doped region, wherein a doping concentration of the second n-doped region is less than a doping concentration of the first n-doped region, and wherein the second n-doped region is closer than the first n-doped region to the undoped pattern.

17. The device of claim 14, wherein the p-doped pattern includes:

a first p-doped region; and a second p-doped region, wherein a doping concentration of the second p-doped region is greater than a doping concentration of the first p-doped region, and wherein the first p-doped region is closer than the second p-doped region to the undoped pattern.

18. The device of claim 14, wherein the metal contact extends into the n-doped pattern from a bottom or top end of the n-doped pattern.

19. An electronic system comprising:

a three-dimensional semiconductor memory device; and a controller electrically connected through an input/output pad to the three-dimensional semiconductor memory device, the controller configured to control the three-dimensional semiconductor memory device, wherein the three-dimensional semiconductor memory device includes:

a circuit structure on a substrate;

a stack structure that includes a plurality of gate electrodes stacked on the circuit structure;

an n-doped pattern on the stack structure;

a vertical structure that extends through the stack structure into the n-doped pattern;

a p-doped pattern on the n-doped pattern; and an undoped pattern between the n-doped pattern and then p-doped pattern, wherein the p-doped pattern includes:

a p-doped horizontal pattern on the undoped pattern; and a p-doped vertical pattern that extends through the undoped pattern and the n-doped pattern and that contacts with the vertical structure.

20. The electronic system of claim 19, wherein the undoped pattern vertically separates the p-doped horizontal pattern from the n-doped pattern.

* * * * *